United States Patent
Suzuki et al.

(10) Patent No.: US 8,513,657 B2
(45) Date of Patent: Aug. 20, 2013

(54) PHOTOELECTRIC CONVERSION ELEMENT AND SOLID-STATE IMAGING DEVICE

(75) Inventors: Hideyuki Suzuki, Kanagawa (JP); Tetsuro Mitsui, Kanagawa (JP)

(73) Assignee: Fujifilm Corporation (JP)

( * ) Notice: Subject to any disclaimer, the term of this patent is extended or adjusted under 35 U.S.C. 154(b) by 389 days.

(21) Appl. No.: 13/023,385

(22) Filed: Feb. 8, 2011

(65) Prior Publication Data

US 2011/0194000 A1 Aug. 11, 2011

(30) Foreign Application Priority Data

Feb. 10, 2010 (JP) .................... 2010-028264
Aug. 26, 2010 (JP) .................... 2010-190105

(51) Int. Cl.
*H01L 35/24* (2006.01)

(52) U.S. Cl.
USPC .................... 257/40; 257/E51.001

(58) Field of Classification Search
USPC .......................... 257/40, E51.001
See application file for complete search history.

(56) References Cited

U.S. PATENT DOCUMENTS

| 8,273,467 B2 * | 9/2012 | Sano et al. | 428/690 |
| 8,277,954 B2 * | 10/2012 | Ise et al. | 428/690 |
| 2007/0215869 A1 * | 9/2007 | Moriya et al. | 257/40 |

FOREIGN PATENT DOCUMENTS

| JP | 10-167994 | 6/1998 |
| JP | 11-255508 | 9/1999 |
| JP | 11-255509 | 9/1999 |
| JP | 2002-241323 A | 8/2002 |
| JP | 2003-196881 A | 7/2003 |
| JP | 2006-131783 A | 5/2006 |
| JP | 2007-088033 A | 4/2007 |
| JP | 2008-231419 A | 10/2008 |
| JP | 2008-288253 A | 11/2008 |
| JP | 2009-126097 A | 6/2009 |

* cited by examiner

*Primary Examiner* — Anthony Ho
(74) *Attorney, Agent, or Firm* — Studebaker & Brackett PC

(57) ABSTRACT

A photoelectric conversion element includes a pair of electrodes, a photoelectric conversion layer, a charge blocking layer, an intermediate layer. The photoelectric conversion layer contains an organic material between the electrodes. The charge blocking layer is disposed between the photoelectric conversion layer and one of the electrodes. The intermediate layer includes an organic compound disposed between the photoelectric conversion layer and the charge blocking layer and having a glass transition temperature of 200° C. or higher.

14 Claims, 2 Drawing Sheets

PHOTOELECTRIC CONVERSION ELEMENT AND SOLID-STATE IMAGING DEVICE

CROSS-REFERENCE TO RELATED APPLICATIONS

This application claims the benefit of Japanese Patent Application Nos. 2010-028264 (filed on Feb. 10, 2010) and 2010-190105 (filed on Aug. 26, 2010), the entire contents of which are hereby incorporated by reference.

BACKGROUND

1. Technical Field

This invention relates to a photoelectric conversion element and a solid-state imaging device.

2. Related Art

Research and development have been directed toward organic photoelectric conversion elements using an organic compound. An organic photoelectric conversion element includes a stack of a photoelectric conversion layer that absorbs light to generate charge, a pair of electrodes having the photoelectric conversion layer therebetween, and a plurality of functional layers such as a charge blocking layer that prevents charge injection from the electrode(s) into the photoelectric conversion layer as described, e.g., in JP-A-2007-88033. Fabricating an imaging device using the organic photoelectric conversion elements includes a color filter forming step, a wire bonding step, and the like steps that involve heating as well as the steps of forming the photoelectric conversion layer, electrodes, and charge blocking layer. Because the photoelectric conversion element or the resulting imaging device is subjected to high temperatures of 200° C. or higher during these heating steps, the organic photoelectric conversion element containing a thermally unstable organic compound is required to undergo no deterioration of performance due to heat treatment at 200° C. or higher.

JP-A-2008-288253A proposes a method of fabricating an organic photoelectric conversion device, which method includes providing an anti-deterioration layer on a photoelectric conversion layer followed by heat treatment (annealing) and removing the anti-deterioration layer after the heat treatment. JP-A-2008-288253 states that the performance of the photoelectric conversion layer is improved by annealing without causing deterioration of the performance of the device. The method, however, does not provide a solution to the problem that the performance of the organic photoelectric conversion device is deteriorated by the high temperature applied in the formation of color filters because the anti-deterioration layer is removed after the annealing.

The deterioration of performance of an organic photoelectric conversion device by the high temperatures of 200° C. or higher could be avoided by making the organic layer of the device of a material having a glass transition temperature (hereinafter "Tg") of 200° C. or higher. Nevertheless, this approach, although it prevents the performance deterioration by heat, narrows the range of choice for the organic layer material, making it difficult to attain high performance properties.

SUMMARY OF THE INVENTION

According to an aspect of the invention, a photoelectric conversion element includes a pair of electrodes, a photoelectric conversion layer, a charge blocking layer, an intermediate layer. The photoelectric conversion layer contains an organic material between the electrodes. The charge blocking layer is disposed between the photoelectric conversion layer and one of the electrodes. The intermediate layer includes an organic compound disposed between the photoelectric conversion layer and the charge blocking layer and having a glass transition temperature of 200° C. or higher.

DETAILED DESCRIPTION

The present invention will be illustrated on the basis of its exemplary embodiments with reference to the accompanying drawings. The solid state imaging device hereinafter described has a plurality of pixels each including an organic photoelectric conversion element. Each organic photoelectric conversion element includes a pair of electrodes, a photoelectric conversion layer containing an organic material disposed between the electrodes, and a charge blocking layer disposed between the photoelectric conversion layer and at least one of the electrodes. The organic photoelectric conversion element is characterized by having an intermediate layer of an organic compound with a Tg of 200° C. or higher between the photoelectric conversion layer and the charge blocking layer.

Made of an organic compound with a Tg of 200° C. or higher, the intermediate layer itself does not transform to a glassy state when a solid state imaging device or a precursor thereof is placed in an environment of around 200° C. in the manufacture of a solid state imaging device. As a result of further study, it has been ascertained that the intermediate layer is able to protect the photoelectric conversion layer and the charge blocking layer from deterioration even when the photoelectric conversion layer and the charge blocking layer are made of materials having a Tg lower than 200° C. Thus, provision of the intermediate layer allows for preventing deterioration of performance properties, such as incident photon to current conversion efficiency (hereinafter "IPCE") of the organic photoelectric conversion element and photo response time, and an increase of dark current.

The thickness of the intermediate layer, which is between the electrode and the photoelectric conversion layer, is influential on the efficiency of transporting carrier (the term carrier means charge to be read as a signal) photogenerated in the photoelectric conversion layer. If the intermediate layer is too thick, the response speed can reduce.

The thickness of the intermediate layer is preferably not more than 10 nm, with which thickness the response speed will not reduce. To ensure improvement in response speed, the thickness is more preferably 5 nm or less, even more preferably 3 nm. An intermediate layer thinner than 3 nm may develop pinholes or other defects, resulting in significant deterioration in device performance. The thickness of the intermediate layer is therefore preferably in the range of from 3 to 10 nm.

The solid state imaging device of the invention will be described with reference to an exemplary embodiment shown in FIGS. 1 and 2.

Figure 1:
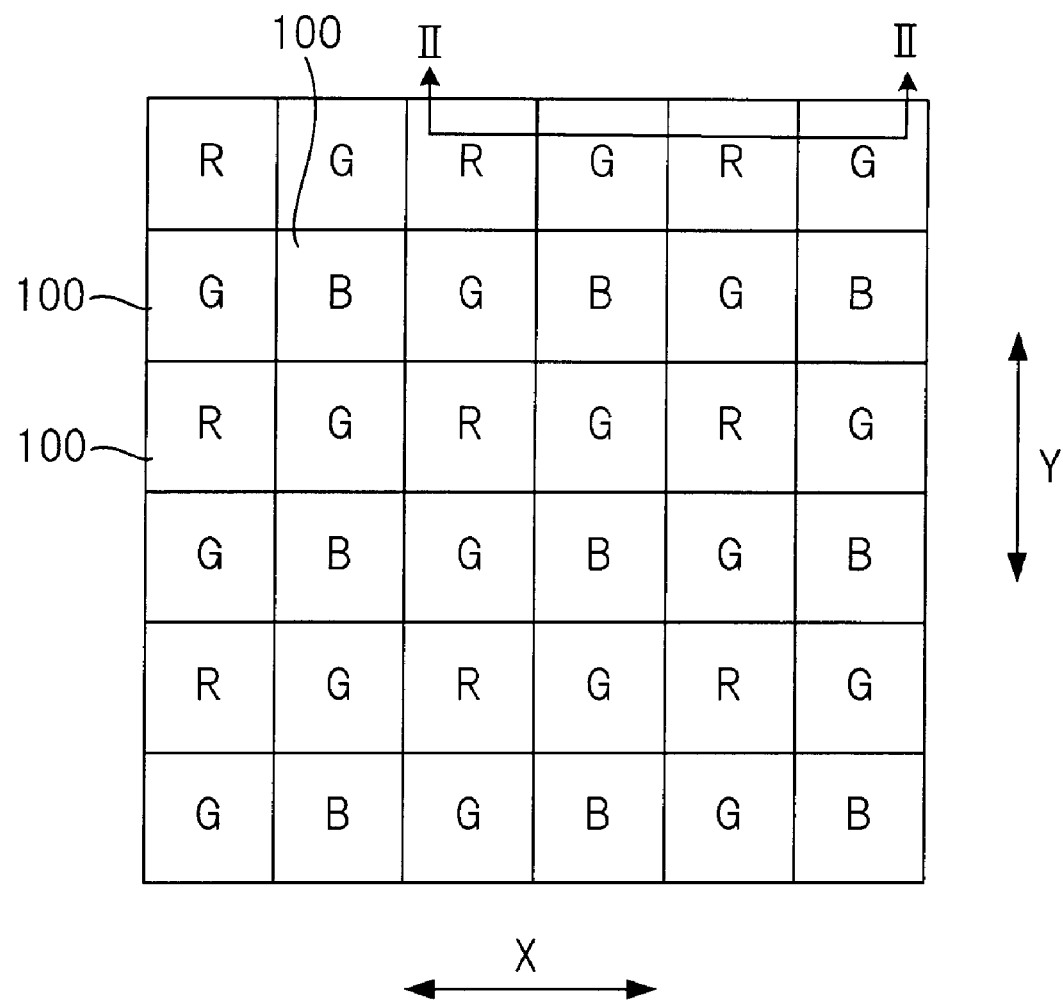
FIG. 1 is a schematic surface view of a solid state imaging device illustrative of an exemplary embodiment of the invention.

FIG. 1 is a schematic surface view illustrative of a solid state imaging device according to an exemplary embodiment of the invention, in which 36 pixels are arranged in 6 rows and 6 columns.

The imaging device of FIG. 1 has pixels 100 arranged two dimensionally on the same plane in both a row direction X and a column direction Y perpendicular to the row direction X (in a square grid in FIG. 1).

The pixels 100 include R pixels detecting red (R) light (indicated by "R" in FIG. 1), G pixels detecting green (G) light (indicated by "G" in FIG. 1), and B pixels detecting blue (B) light (indicated by "B" in FIG. 1).

In FIG. 1, R pixels and G pixels alternate in the row direction X to make RG rows. G pixels and B pixels alternate in the row direction X to make GB rows. The RG rows and the GB rows alternate in the column direction Y.

Figure 2:
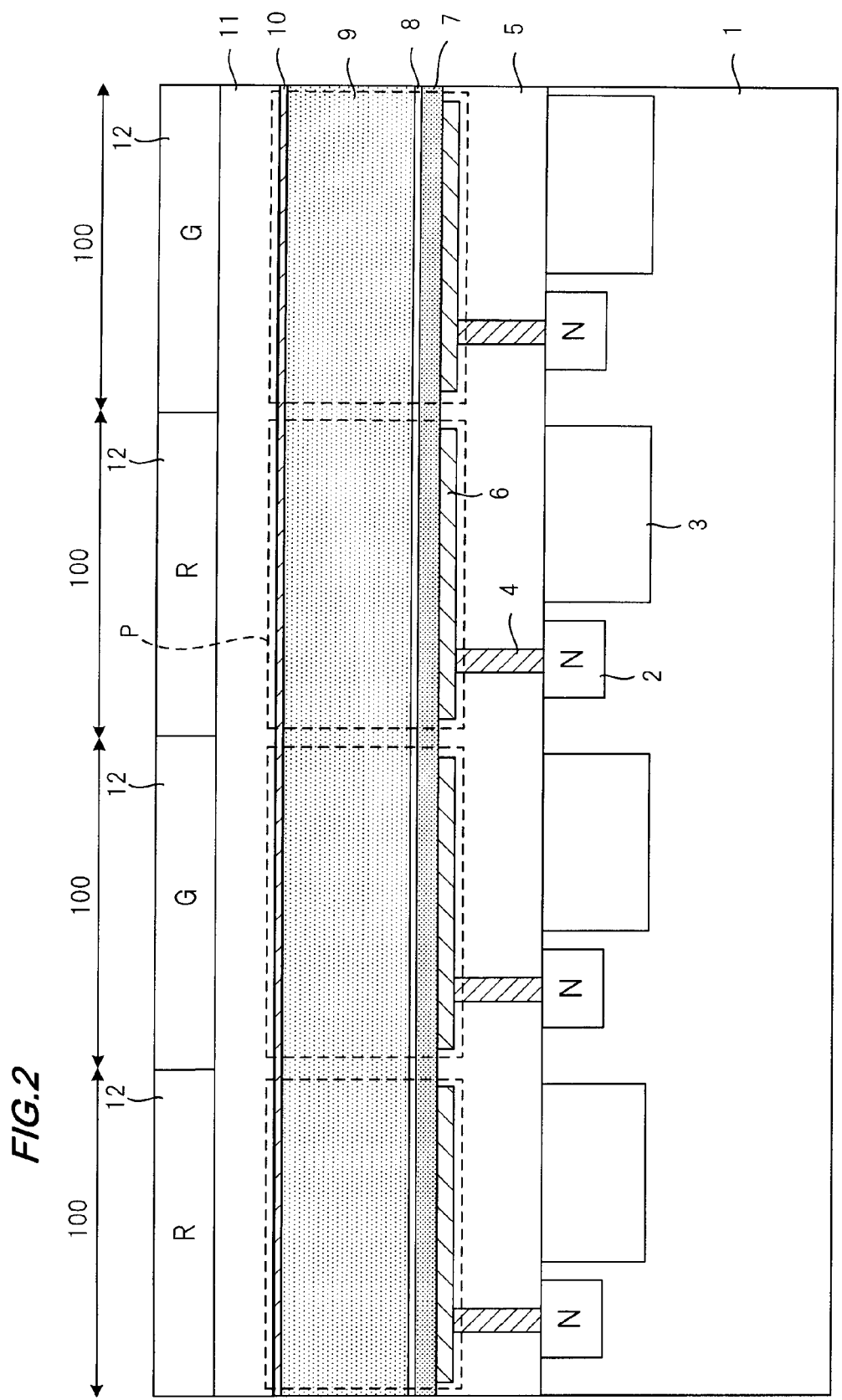
FIG. 2 is a schematic cross-section of the solid state imaging device of FIG. 1, taken along line II-II.

FIG. 2 is a schematic cross-section of the solid state imaging device of FIG. 1, taken along line II-II. As illustrated, each pixel 100 includes a charge storage portion 2, a read-out portion 3, a vertical interconnect 4, an organic photoelectric conversion element P, and a color filter 12.

The organic photoelectric conversion element P receives light to generate charge in response to the light received. The organic photoelectric conversion element P has a pixel electrode 6, a charge blocking layer 7, an intermediate layer 8, a photoelectric conversion layer 9, and a counter electrode 10 stacked in the order named on a silicon substrate 1.

Each pixel 100 has a dedicated pixel electrode 6. The charge blocking layer 7, the intermediate layer 8, the photoelectric conversion layer 9, and the counter electrode 10 are each shared by all the pixels 100.

The charge storage portion 2 stores the charge photogenerated in the organic photoelectric conversion element P. The charge storage portion 2 is a doped n region formed in a p well layer formed in the surface portion of the silicon substrate 1.

The read out portion 3 converts the charge stored in the charge storage portion 2 to a corresponding signal and outputs the signal. The read out portion 3 has, for example, a circuit composed of a charge coupled device and an amplifier or a metal oxide semiconductor (MOS) circuit using an MOS transistor.

The vertical interconnect 4 provides an electrical connection between the pixel electrode 6 and the charge storage portion 2 and is formed of a conductive material, such as metal, on the charge storage portion 6.

The pixel electrode 6 collects the carrier photogenerated in the photoelectric conversion layer 9. The pixel electrode 6 and the interconnect 4 are formed in an insulating layer 5 which is provided on the silicon substrate 1.

The charge blocking layer 7 blocks charges from the pixel electrode 6 from being injected into the photoelectric conversion layer 9. The charge blocking layer 7 may have a single layer structure or a multilayer structure having two or more layers. The charge blocking layer 7 is preferably made of a material providing a high barrier against the charge injection from the adjacent electrode and exhibiting high carrier transport properties.

In the case where the pixel electrode 6 is designed to collect electrons, the charge blocking layer 7 is a hole blocking layer that prevents holes from entering the photoelectric conversion layer 9. When the pixel electrode 6 is designed to collect holes, the charge blocking layer 7 is an electron blocking layer that blocks electrons from moving into the photoelectric conversion layer 9.

The intermediate layer 8 serves to prevent the organic photoelectric conversion element P from deteriorating its performance when placed in an environment at 200° C. or higher. The intermediate layer 8 is made of a material having a Tg of 200° C. or higher, such as an organic compound having a tert-butyl group. As previously discussed, the thickness of the intermediate layer 8 is preferably 10 nm or smaller, more preferably 5 nm or smaller, even more preferably 3 nm.

The organic compound with a Tg of 200° C. or higher will be described in more detail. The organic compound with a Tg of 200° C. or higher is not particularly limited but preferably has a large molecular size. The organic compound with a Tg of 200° C. or higher preferably has a branched alkyl group, particularly a tert-butyl group. An organic compound may be designed to have a desired Tg by increasing the molecular size or incorporating a bulky substituent such as a branched alkyl group. It is desirable that the organic compound with a Tg of 200° C. or higher be freed from impurities by sublimation.

The organic compound with a Tg of 200° C. or higher is preferably represented by formula (1) below. The compound of formula (1), which contains a carbazole or fluorene structure, has a large molecular size and a high Tg and thereby provides a photoelectric conversion element having high heat resistance when used to make the intermediate layer.

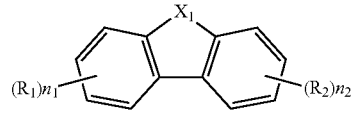

(1)

wherein each of $R_1$ and $R_2$ independently represents a heterocyclic group optionally substituted with an alkyl group; $X_1$ represents —$CR_3R_4$— or —$NR_5$—; each of $R_3$ and $R_4$ independently represents an alkyl group; $R_5$ represents an aryl group optionally substituted with an alkyl group; each of $n_1$ and $n_2$ independently represents an integer of 1 to 4; and the compound may be dimerized through $R_2$ representing a single bond.

The heterocyclic group as represented by $R_1$ and $R_2$ may be a bi- to tetracyclic condensed ring system and preferably contains 6 to 30, more preferably 6 to 20, carbon atoms. The alkyl group as a substituent on the heterocyclic group is preferably a C1-C6 alkyl group which may be straight, branched, or cyclic and is preferably branched. Examples of the alkyl group include methyl, ethyl, isopropyl, tert-butyl, and neopentyl, with t-butyl being preferred.

Examples of the heterocyclic group optionally substituted with alkyl as represented by $R_1$ and $R_2$ are shown below, of which N2 to N4, N7, and N13 to N15 are preferred, and N2, N7, and N13 are more preferred.

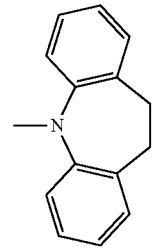

N1

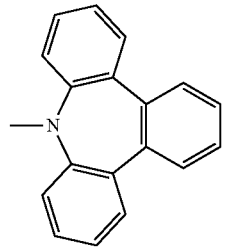

N2

-continued
N3 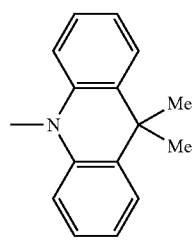
N4 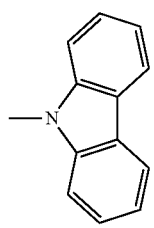
N5 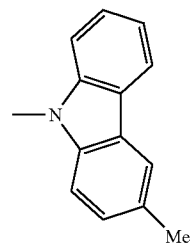
N6 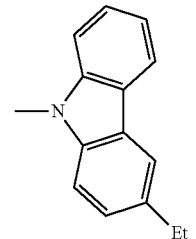
N7 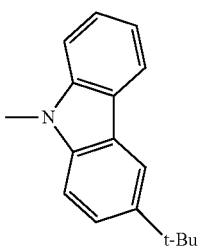
N8 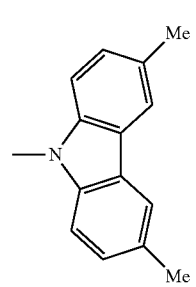
-continued
N9 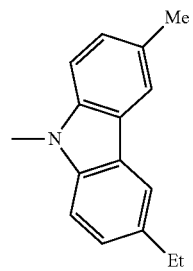
N10 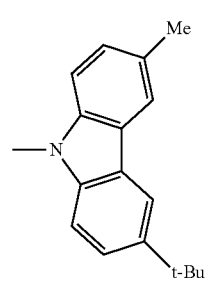
N11 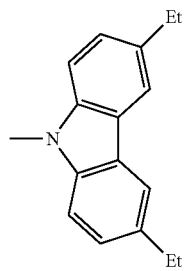
N12 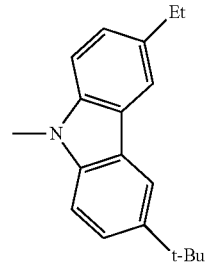
N13 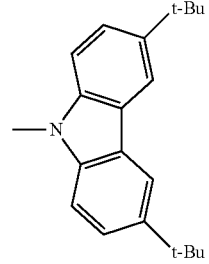
N14 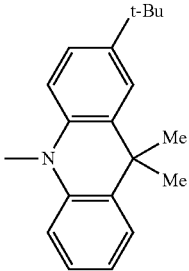

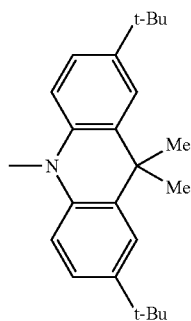
N15

The alkyl group as represented by $R_3$ and $R_4$ is preferably C1-C6 alkyl, more preferably C1-C4 alkyl, such as methyl, ethyl, n-propyl, isopropyl, n-butyl, isobutyl, and t-butyl, with methyl and ethyl being more preferred. Methyl is the most preferred.

The aryl group as $R_5$ is preferably C6-C30 aryl, more preferably C6-C18 aryl. The aryl may be substituted with alkyl and is preferably C6-C18 aryl optionally substituted with C1-C4 alkyl. Preferred examples of the aryl group are phenyl, naphthyl, anthryl, methylphenyl, dimethylphenyl, and biphenyl, with methylphenyl being particularly preferred.

Each of $n_1$ and $n_2$ preferably represents 1 or 2, more preferably 1.

Of the compounds represented by formula (1), preferred are the following compounds.

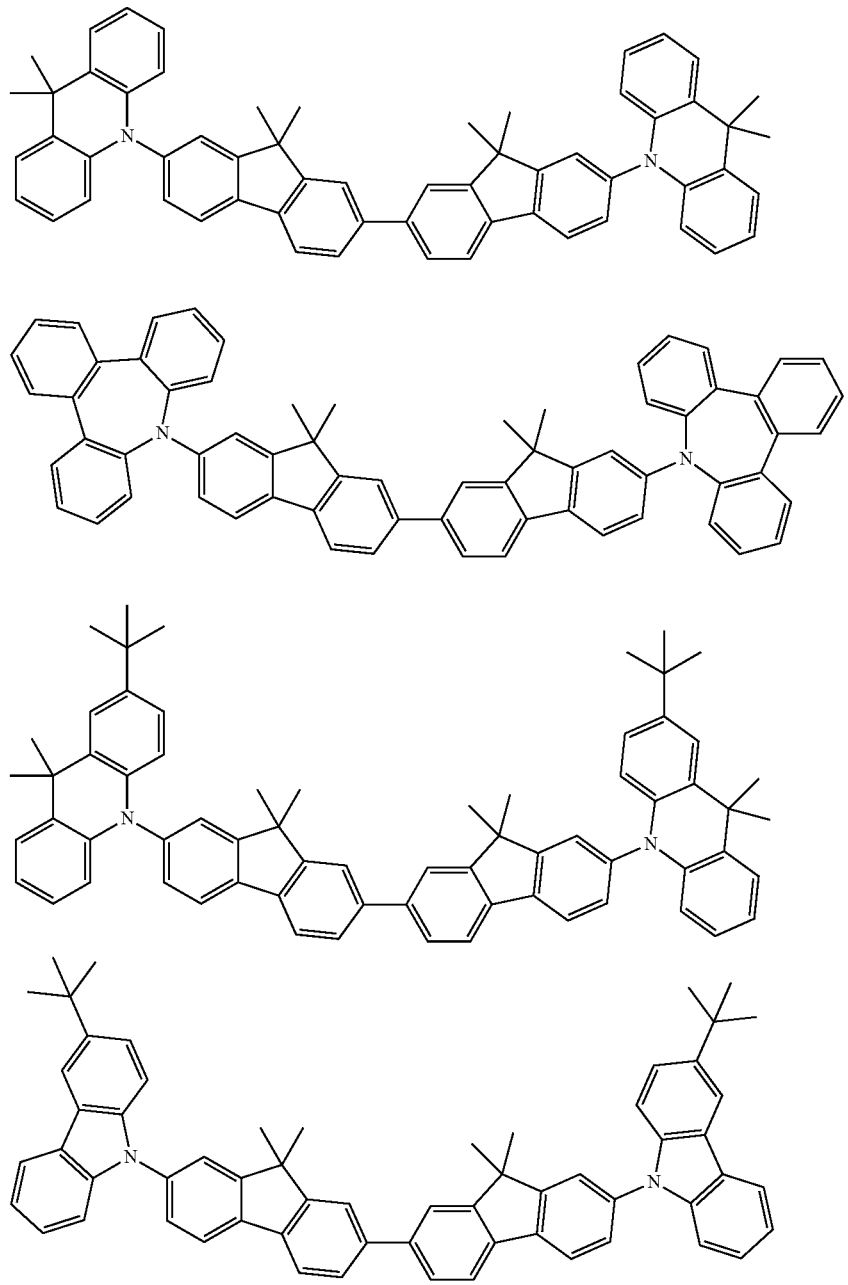

-continued
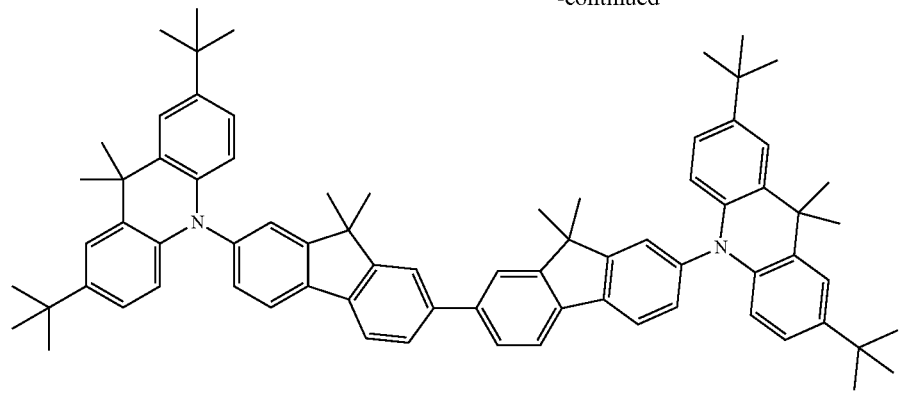
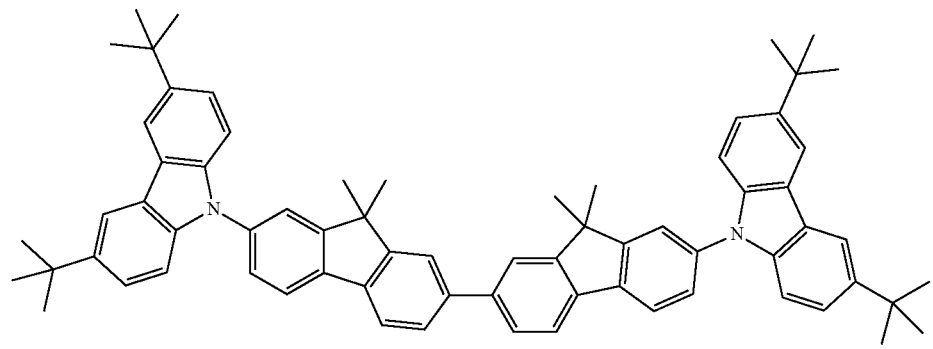
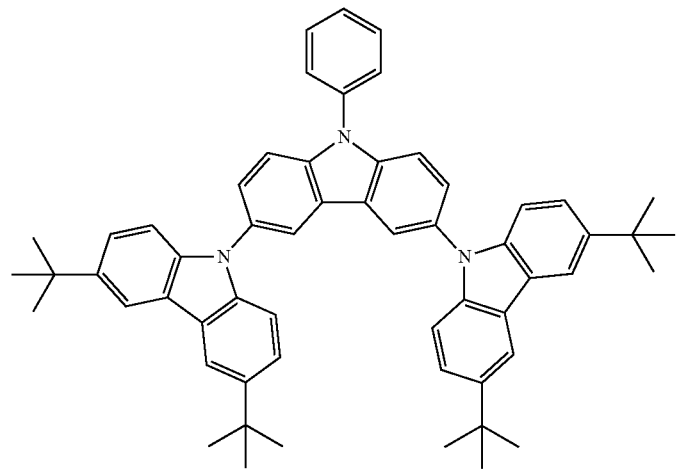
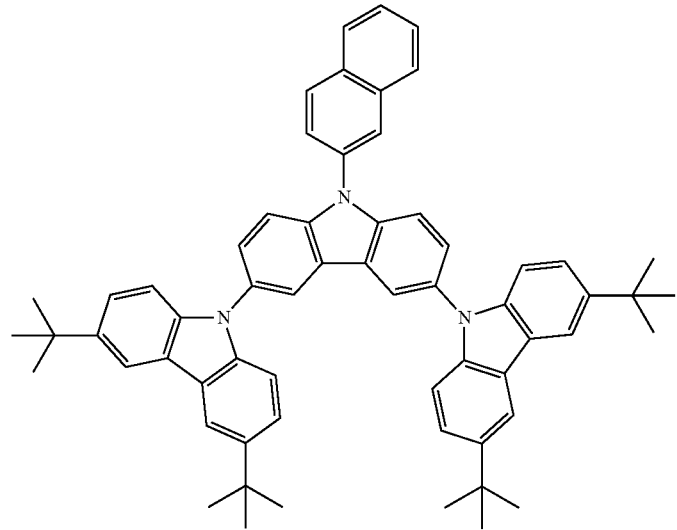

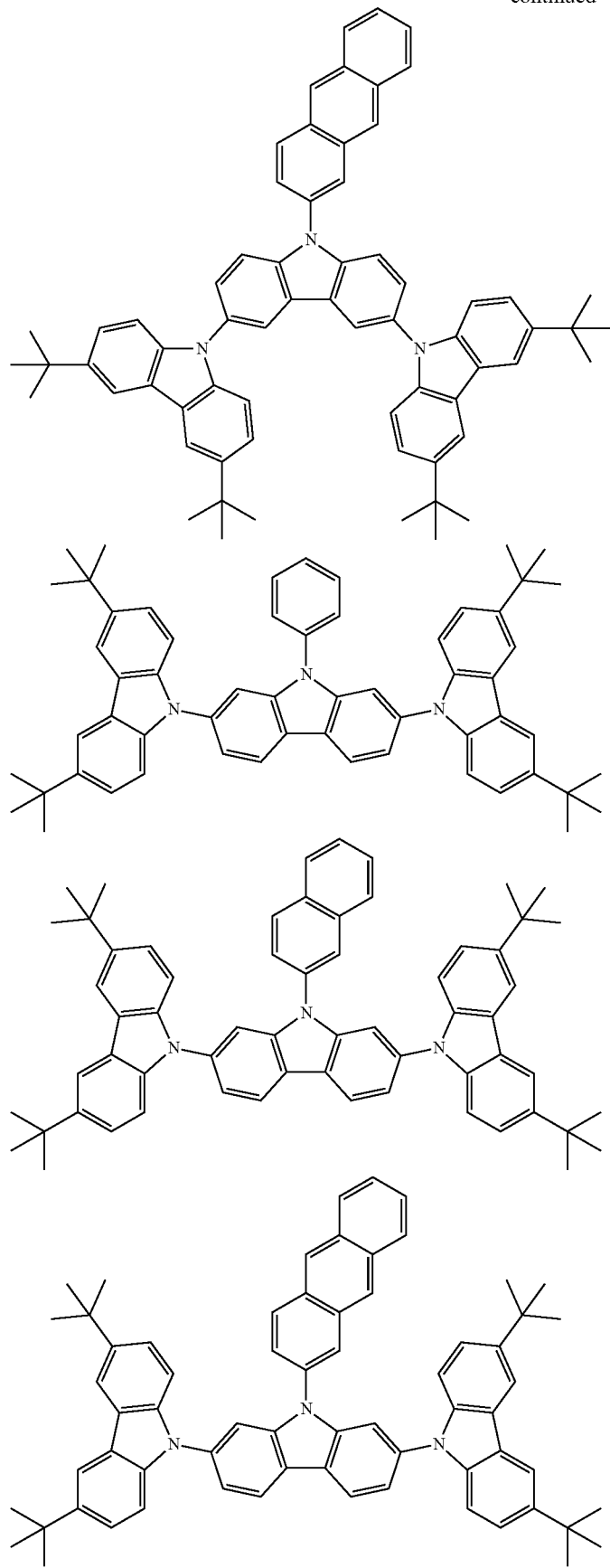

-continued
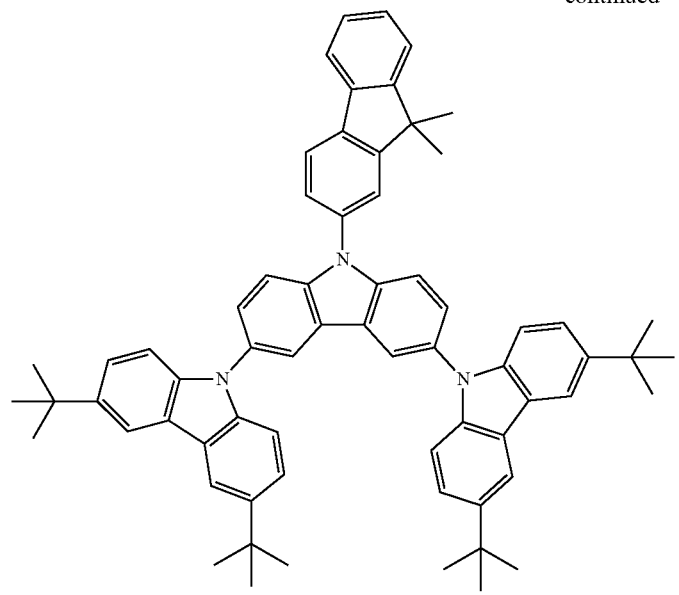
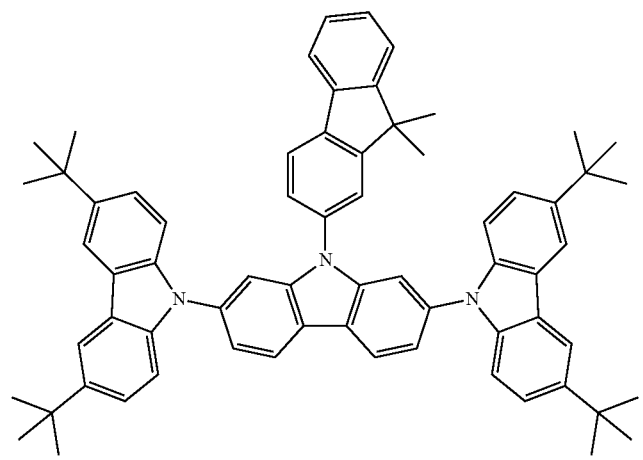
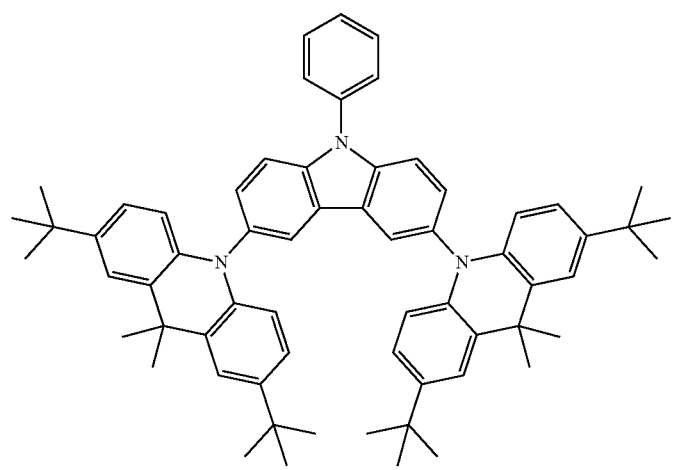

-continued
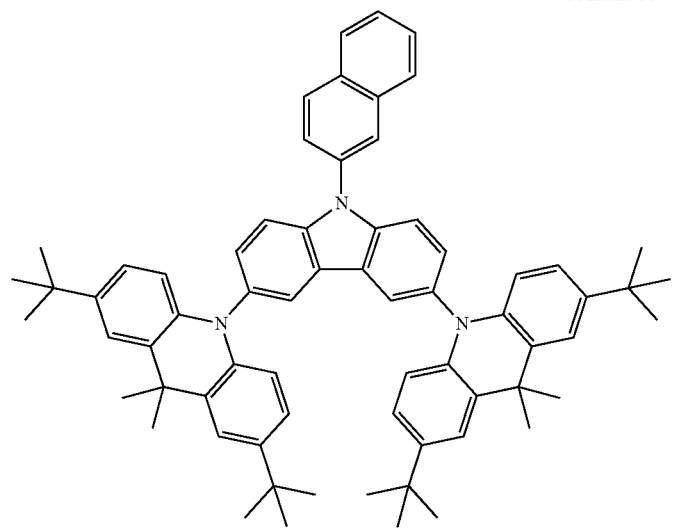
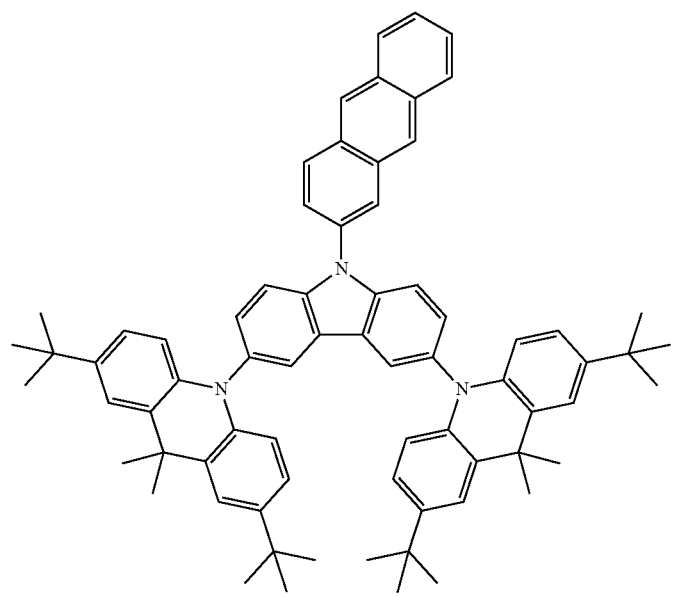
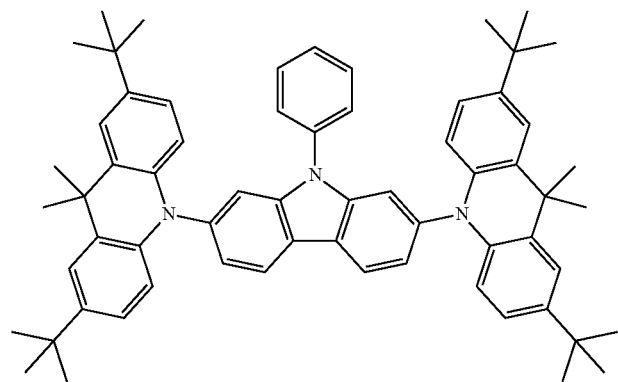

-continued
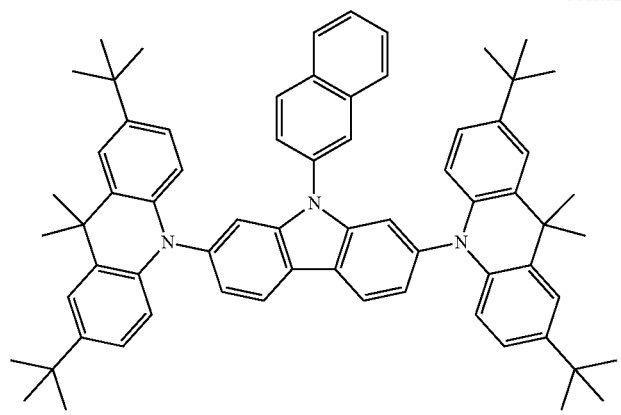
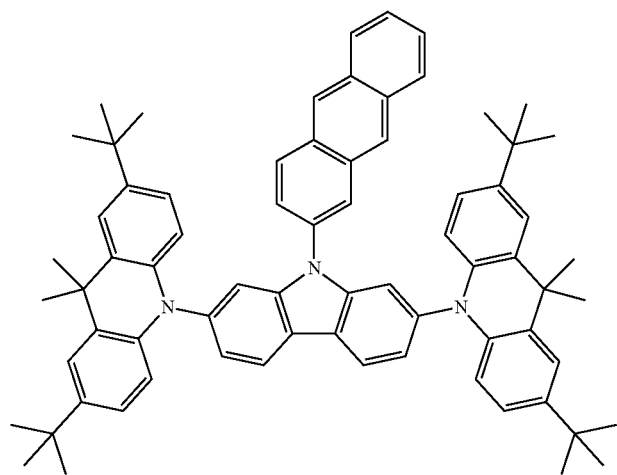
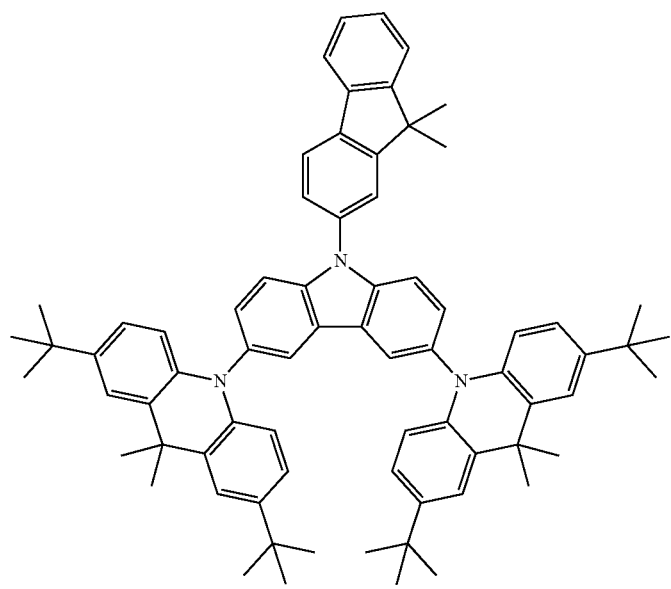

-continued
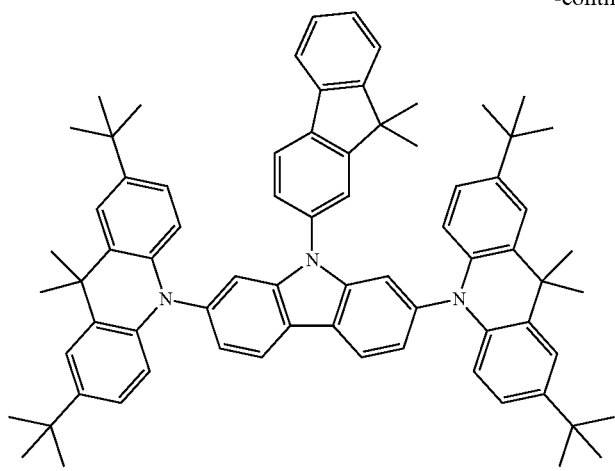
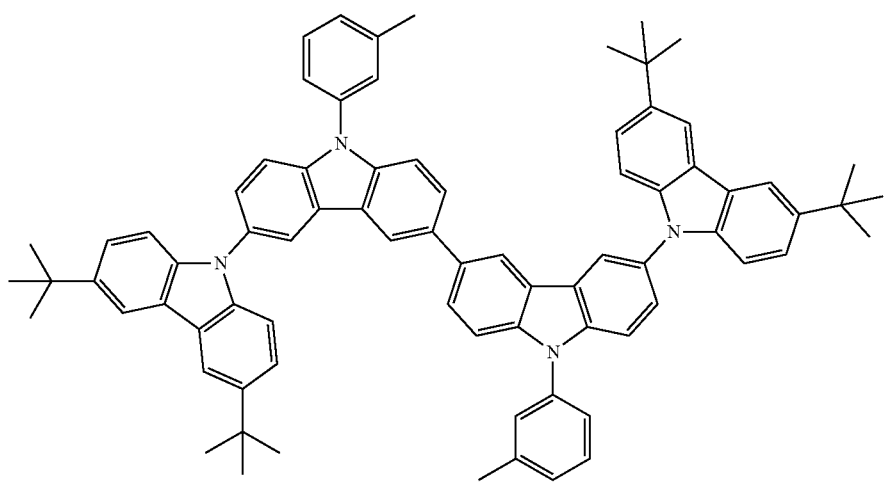
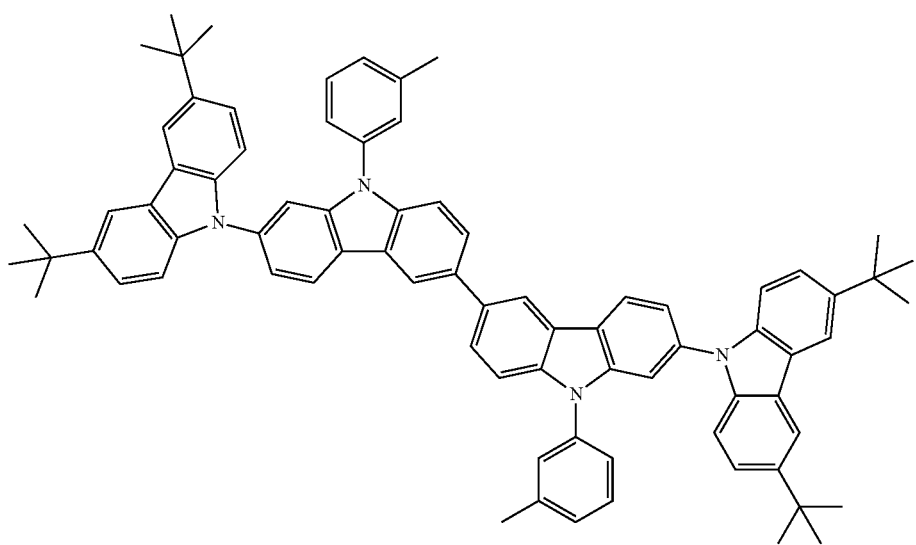

-continued

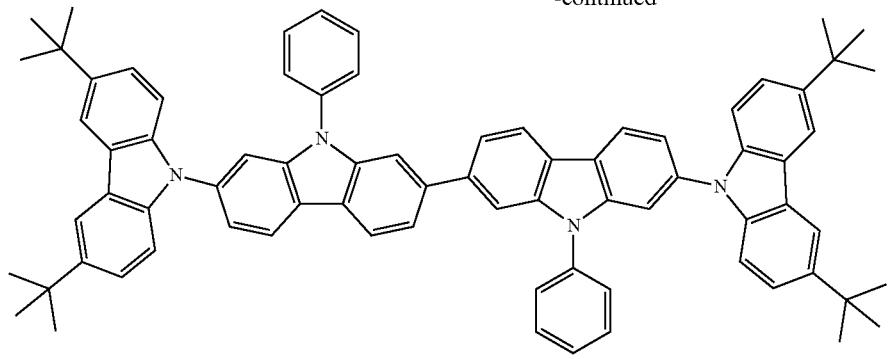

The total thickness of the charge blocking layer 7 and the intermediate layer 8 is preferably 20 nm or greater, more preferably 50 nm or greater. The charge blocking layer 7 should have at least a certain thickness because otherwise the blocking layer will have reduced performance. It is particularly preferred that the total thickness of the charge blocking layer 7 and the intermediate layer 8 be in the range of from 53 to 100 nm.

The photoelectric conversion layer 9 contains an organic photoelectric material that absorbs light and generates charge in response to the light absorbed. It is desirable for each of the charge blocking layer 7 and the photoelectric conversion layer 9 contain a material having a lower Tg than the intermediate layer 8, which is advantageous to improve the heat resistance while achieving the improvement on photo response speed.

Since the solid state imaging device of the present embodiment performs color separation by using color filters, the photoelectric conversion layer 9 is made of a material sensitive to the entire visible spectrum. While the material making the photoelectric conversion layer 9 is not particularly limited, it is advantageous for achieving good performance to form a bulk heterojunction structure of a mixture of a p type organic semiconductor and an n type organic semiconductor by, for example, co-deposition.

The p type semiconductor (compound) is a donating organic semiconductor (compound), i.e., an organic compound having electron donating character, which is mostly exemplified by a hole transporting organic compound. In some detail, when two organic materials are used in contact with each other, the material having a smaller ionization potential is called an electron donating compound. Any electron donating organic compound may be used, including triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic carbocyclic compounds (e.g., naphthalene derivatives, anthracene derivatives, phenanthrene derivatives, tetracene derivatives, pyrene derivatives, perylene derivatives, and fluoranthene derivatives), and metal complexes having a nitrogen-containing heterocyclic compound as a ligand. In addition, any organic compounds having a smaller ionization potential than an organic compound used as an n type organic semiconductor may be used as a donating organic semiconductor.

Any organic dyes may be used as an organic p type semiconductor. Examples of preferred organic dyes include, but are not limited to, cyanine dyes, styryl dyes, hemicyanine dyes, merocyanine dyes (including zeromethine merocyanine (simple merocyanine)), trinuclear merocyanine dyes, tetranuclear merocyanine dyes, rhodacyanine dyes, complex cyanine dyes, complex merocyanine dyes, allopolar dyes, oxonol dyes, hemioxonol dyes, squarylium dyes, chroconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugide dyes, perylene dyes, perinone dyes, phenazine dyes, phenothiazine dyes, quinone dyes, diphenylmethane dyes, polyene dyes, acridine dyes, acridinone dyes, diphenylamine dyes, quinacridone dyes, quinophthalone dyes, phenoxazine dyes, phthaloperylene dyes, diketopyrrolopyrrole dyes, dioxane dyes, porphyrin dyes, chlorophyll dyes, phthalocyanine dyes, metal complex dyes, and condensed aromatic carbocyclic compound dyes (e.g., naphthalene derivatives, anthracene derivatives, phenanthrene derivatives, tetracene derivatives, pyrene derivatives, perylene derivatives, and fluoranthene derivatives).

Preferred organic n type semiconductors are fullerenes and their derivatives. Examples of fullerenes include fullerene $C_{60}$, $C_{70}$, $C_{76}$, $C_{78}$, $C_{80}$, $C_{82}$, $C_{84}$, $C_{90}$, $C_{96}$, $C_{240}$, and $C_{540}$, mixed fullerenes, and fullerene nanotube. Fullerene derivatives are compounds derived from these fullerenes by addition of a substituent.

In what follows, the term "group" as used to indicate a specific group of atoms implies not only an unsubstituted group but a group substituted with up to the maximum possible number of substituents which may be identical or different. For instance, the term "alkyl group" is intended to mean a substituted or unsubstituted alkyl group. The compounds according to the invention may have any substituent.

The substituent will be inclusively referred to as a substituent W. Examples of the substituent W include, but are not limited to, a halogen atom, an alkyl (including cyclo-, bicyclo-, and tricycloalkyl) group, an alkenyl (including cyclo- and bicycloalkenyl) group, an alkynyl group, an aryl group, a heterocyclic (hetero ring) group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino (including anilino) group, an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphate group (—OPO(OH)$_2$), a sulfato group (–OSO$_3$H), and other known substituents.

More specifically, examples of the halogen as substituent W include fluorine, chlorine, bromine, and iodine. The alkyl group as substituent W may be substituted or unsubstituted and may be straight, branched, or cyclic. That is, the term "alkyl group" includes a substituted or unsubstituted straight or branched chain alkyl group preferably having up to 30 carbon atoms (e.g., methyl, ethyl, n-propyl, isopropyl, t-butyl, n-octyl, eicosyl, 2-chloroethyl, 2-cyanoethyl, or 2-ethylhexyl), a substituted or unsubstituted monocycloalkyl group preferably having 3 to 30 carbon atoms (e.g., cyclohexyl, cyclopentyl, or 4-n-dodecylcyclohexyl), a substituted or unsubstituted bicycloalkyl group preferably having 5 to 30 carbon atoms (i.e., a monovalent group derived from C5-C30 bicycloalkane by removal of one hydrogen, e.g., bicyclo[1,2,2]heptan-2-yl or bicyclo[2,2,2]octan-3-yl), and a higher polycyclic (e.g., tricyclic) alkyl group. The definition for the term "alkyl" applies to the alkyl moiety of the other substituents W (such as the alkyl moiety of alkylthio, alkenyl, or alkynyl).

The alkenyl group as substituent W may be substituted or unsubstituted and may be straight, branched, or cyclic. That is, the term "alkenyl group" includes a substituted or unsubstituted straight or branched chain alkenyl group preferably having 2 to 30 carbon atoms (e.g., vinyl, allyl, prenyl, geranyl, or oleyl), a substituted or unsubstituted monocycloalkenyl group preferably having 3 to 30 carbon atoms (e.g., a monovalent group derived from a C3-C30 cycloalkene by removal of one hydrogen atom, e.g., 2-cyclopenten-1-yl or 2-cyclohexen-1-yl), and a substituted or unsubstituted bicycloalkenyl group preferably having 5 to 30 carbon atoms (i.e., a monovalent group derived from a C5-C30 bicycloalkene having one double bond by removal of one hydrogen atom, e.g., bicyclo[1,2,2]hepten-2-yl or bicyclo[2,2,2]octen-3-yl).

The alkynyl group as substituent W, which may be substituted or unsubstituted, is preferably a C2-C30 alkynyl group, such as ethynyl, propargyl, or trimethylsilylethynyl. The aryl group is preferably a substituted or unsubstituted C6-C30 aryl group, such as phenyl, p-tolyl, naphthyl, m-chlorophenyl, or o-hexadecanoylaminophenyl. The heterocyclic group is preferably a substituted or unsubstituted, 5- or 6-membered, monovalent group derived from an aromatic or nonaromatic heterocyclic compound by removal of one hydrogen atom, more preferably a C3-C30, 5- or 6-membered aromatic heterocyclic group, such as 2-furyl, 2-thienyl, 2-pyrimidinyl, or 2-benzothiazolyl. The heterocyclic group may be a cationic heterocyclic group, such as 1-methyl-2-pyridinio or 1-methyl-2-quinolinio. The alkoxy group is preferably a substituted or unsubstituted C1-C30 alkoxy group, e.g., methoxy, ethoxy, isopropoxy, t-butoxy, n-octyloxy, or 2-methoxyethoxy. The aryloxy group is preferably a substituted or unsubstituted C6-C30 aryloxy group, e.g., phenoxy, 2-methylphenoxy, 4-t-butylphenoxy, 3-nitrophenoxy, or 2-tetradecanoylaminophenoxy. The silyloxy group is preferably a C3-C20 silyloxy group, such as trimethylsilyloxy or t-butyldimethylsilyloxy. The heterocyclic oxy group is preferably a substituted or unsubstituted C2-C30 heterocyclic oxy group, such as 1-phenyltetrazole-5-oxy or 2-tetrahydropyranyloxy. The acyloxy group is preferably a formyloxy group, a substituted or unsubstituted C2-C30 alkylcarbonyloxy group (e.g., acetyloxy, pivaloyloxy, or stearoyloxy), or a substituted or unsubstituted C7-C30 arylcarbonyloxy group (e.g., benzoyloxy or p-methoxyphenylcarbonyloxy). The carbamoyloxy group is preferably a substituted or unsubstituted C1-C30 carbamoyloxy group, such as N,N-dimethylcarbamoyloxy, N,N-diethylcarbamoyloxy, morpholinocarbonyloxy, N,N-di-n-octylaminocarbonyloxy, or N-n-octylcarbamoyloxy. The alkoxycarbonyloxy group is preferably a substituted or unsubstituted C2-C30 alkoxycarbonyloxy group, such as methoxycarbonyloxy, ethoxycarbonyloxy, t-butoxycarbonyloxy, or n-octylcarbonyloxy. The aryloxycarbonyloxy group is preferably a substituted or unsubstituted C7-C30 aryloxycarbonyloxy group, such as phenoxycarbonyloxy, p-methoxyphenoxycarbonyloxy, or p-n-hexadecyloxyphenoxycarbonyloxy. The amino group is preferably an unsubstituted amino group, a substituted or unsubstituted C1-C30 alkylamino group (e.g., methylamino or dimethylamino), or a substituted or unsubstituted C6-C30 anilino group (e.g., anilino, N-methylanilino, or diphenylamino). The ammonio group is preferably an unsubstituted ammonio group or an ammonio group substituted with a C1-C30, substituted or unsubstituted alkyl, aryl or heterocyclic group (e.g., trimethylammonio, triethylammonio, or diphenylmethylammonio). The acylamino group is preferably a formylamino group, a substituted or unsubstituted C2-C30 alkylcarbonylamino group (e.g., acetylamino, pivaroylamino, or lauroylamino), or a substituted or unsubstituted C7-C30 arylcarbonylamino group (e.g., benzoylamino or 3,4,5-tri-n-octyloxyphenylcarbonylamino). The aminocarbonylamino group is preferably a substituted or unsubstituted C1-C30 aminocarbonylamino group, such as carbamoylamino, N,N-dimethylaminocarbonylamino, N,N-diethylaminocarbonylamino, or morpholinocarbonylamino. The alkoxycarbonylamino group is preferably a substituted or unsubstituted C2-C30 alkoxycarbonylamino group, such as methoxycarbonylamino, ethoxycarbonylamino, t-butoxycarbonylamino, n-octadecyloxycarbonylamino, or N-methyl-methoxycarbonylamino. The aryloxycarbonylamino group is preferably a substituted or unsubstituted C7-C30 aryloxycarbonylamino group, such as phenoxycarbonylamino, p-chlorophenoxycarbonylamino, or m-n-octyloxyphenoxycarbonylamino. The sulfamoylamino group is preferably a substituted or unsubstituted C0-C30 sulfamoylamino group, such as sulfamoylamino, N,N-dimethylaminosulfonylamino, or N-n-octylaminosulfonylamino. The alkyl- or arylsulfonylamino group is preferably a substituted or unsubstituted C1-C30 alkylsulfonylamino group (e.g., methylsulfonylamino or butylsulfonylamino) or a substituted or unsubstituted C6-C30 arylsulfonylamino group (e.g., phenylsulfonylamino, 2,3,5-trichlorophenylsulfonylamino, or p-methylphenylsulfonylamino). The alkylthio group is preferably a substituted or unsubstituted C1-C30 alkylthio group, such as methylthio, ethylthio, or n-hexadecylthio. The arylthio group is preferably a substituted or unsubstituted C6-C30 arylthio group, such as phenylthio, p-chlorophenylthio, or m-methoxyphenylthio. The heterocyclic thio group is preferably a substituted or unsubstituted C2-C30 heterocyclic thio group, such as 2-benzothiazolylthio or 1-phenyltetrazol-5-ylthio. The sulfamoyl group is preferably a substituted or unsubstituted C0-C30 sulfamoyl group, such as N-ethylsulfamoyl, N-(3-dodecyloxypropyl)sulfamoyl, N,N-dimethylsulfamoyl, N-acetylsulfamoyl, N-benzoylsulfamoyl, or N—(N'-phenylcarbamoyl)sulfamoyl. The alkyl- or arylsulfinyl group is preferably a substituted or unsubstituted C1-C30 alkylsulfinyl group (e.g., methylsulfinyl or ethylsulfinyl) or a substituted or unsubstituted C6-C30 arylsulfinyl group (e.g., phenylsulfinyl or p-methylphenylsulfinyl). The alkyl- or arylsulfonyl group is preferably a substituted or unsubstituted C1-C30 alkylsulfonyl group (e.g., methylsulfonyl or ethylsulfonyl) or a substituted or unsubstituted C6-C30 arylsulfonyl group (e.g., phenylsulfonyl or p-methylphenylsulfonyl). The acyl group is preferably a formyl group, a substituted or unsubstituted C2-C30 alkylcarbonyl group (e.g., acetyl, pivaloyl, 2-chloroacetyl, or stearoyl), a substituted or unsubstituted C7-C30 arylcarbonyl group (e.g., benzoyl or p-n-octyloxyphenylcarbonyl), or a substituted or unsubstituted C4-C30 heterocyclic carbonyl group in which the carbonyl is bonded to the carbon atom of the hetero ring (e.g., 2-pyridylcarbonyl or 2-furylcarbonyl). The aryloxycarbonyl group is preferably a substituted or unsubstituted C7-C30 aryloxycarbonyl group, such as phenoxycarbonyl, o-chlorophenoxycarbonyl, m-nitrophenoxycarbonyl, or p-t-butylphenoxycarbonyl). The alkoxycarbonyl group is preferably a substituted or unsubstituted C2-C30 alkoxycarbonyl group, such as methoxycarbonyl, ethoxycarbonyl, t-butoxycarbonyl, or n-octadecyloxycarbonyl. The carbamoyl group is preferably a substituted or unsubstituted C1-C30 carbamoyl group, such as carbamoyl, N-methylcarbamoyl, N,N-dimethylcarbamoyl, N,N-di-n-octylcarbamoyl, or N-(methylsulfonyl)carbamoyl. The arylazo group is preferably a substituted or unsubstituted C6-C30 arylazo group, such as phenylazo or p-chlorophenylazo. The heterocyclic azo group is preferably a substituted or unsubstituted C3-C30 heterocyclic azo group, such as 5-ethylthio-1,3,4-thiadiazol-2-ylazo. The imido group is preferably N-succinimido or N-phthalimido. The phosphino group is preferably a substituted or unsubstituted C2-C30 phosphino group, such as dimethylphosphino, diphenylphosphino, or methylphenoxyphosphino. The phosphinyl group is preferably a substituted or unsubstituted C2-C30 phosphinyl group, such as phosphinyl, dioctyloxyphosphinyl, or diethoxyphosphinyl. The phosphinyloxy group is preferably a substituted or unsubstituted C2-C30 phosphinyloxy group, such as diphenoxyphosphinyloxy or dioctyloxyphosphinyloxy. The phosphinylamino group is preferably a substituted or unsubstituted C2-C30 phosphinylamino group, such as dimethoxyphosphinylamino or dimethylaminophosphinylamino. The silyl group is preferably a substituted or unsubstituted C3-C30 silyl group, such as trimethylsilyl, t-butyldimethylsilyl, or phenyldimethylsilyl. The hydrazino group is preferably a substituted or unsubstituted C0-C30 hydrazino group, such as trimethylhydrazino. The ureido group is preferably a substituted or unsubstituted C0-C30 ureido group, such as N,N-dimethylureido.

Two substituents W may be taken together to form a ring structure, including an aromatic or nonaromatic hydrocarbon ring, an aromatic or nonaromatic heterocyclic ring, and a condensed ring system composed of two or more of these rings. Examples of such a ring structure include benzene, naphthalene, anthracene, phenanthrene, fluorene, triphenylene, naphthacene, biphenyl, pyrrole, furan, thiophene, imidazole, oxazole, thiazole, pyridine, pyrazine, pyrimidine, pyridazine, indolizine, indole, benzofuran, benzothiophene, isobenzofuran, benzimidazole, imidazopyridine, quinolidine, quinoline, phthalazine, naphthyridine, quinoxaline, isoquinoline, carbazole, phenanthridine, acridine, phenanthroline, thianthrene, chromene, xanthene, phenoxathiin, phenothiazine, and phenazine.

Of the substituents W those having hydrogen may have the hydrogen displaced with the above described group. Examples of the substituents having hydrogen include —CONHSO$_2$— (sulfonylcarbamoyl or carbonylsulfamoyl), —CONHCO— (carbonylcarbamoyl), and —SO$_2$NHSO$_2$— (sulfonylsulfamoyl). Specific examples of the thus derived substituents are alkylcarbonylaminosulfonyl (e.g., acetylaminosulfonyl), arylcarbonylaminosulfonyl (e.g., benzoylaminosulfonyl), alkylsulfonylaminocarbonyl (e.g., methylsulfonylaminocarbonyl), and arylsulfonylaminocarbonyl (e.g., p-methylphenylsulfonylaminocarbonyl).

The fullerene derivative is preferably represented by formula (2).

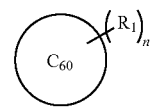

wherein R$_1$ represents a substituent, such as the substituent W; and n represents an integer 1 to 60.

The substituent as R$_1$ is preferably an alkyl group, an aryl group, or a heterocyclic group. The preference on the substituent R$_1$ and examples of the preferred substituent R$_1$ are identical to those described with respect to the substituent W. The alkyl group as R$_1$ is more preferably a C1 to C12 alkyl group. Examples of preferred aryl and heterocyclic groups are benzene, naphthalene, anthracene, phenanthrene, fluorene, triphenylene, naphthacene, biphenyl, pyrrole, furan, thiophene, imidazole, oxazole, thiazole, pyridine, pyrazine, pyrimidine, pyridazine, indolizine, indole, benzofuran, benzothiophene, isobenzofuran, benzimidazole, imidazopyridine, quinolidine, quinoline, phthalazine, naphthyridine, quinoxaline, quinoxazoline, isoquinoline, carbazole, phenanthridine, acridine, phenanthroline, thianthrene, chromene, xanthene, phenoxathiin, phenothiazine, and phenazine. Examples of more preferred aryl and heterocyclic groups are benzene, naphthalene, anthracene, phenanthrene, pyridine, imidazole, oxazole, and thiazole. Particularly preferred of these aryl and heterocyclic groups are benzene, naphthalene, and pyridine. The substituent R$_1$ may have one or more substituents which may be taken together to form a ring.

n is preferably 1 to 10. When n is 2 or greater, each R$_1$ may be the same as or different from each other R$_1$. The two or more R$_1$'s may be taken together to form a ring structure if possible.

Specific but non-limiting examples of the fullerene derivatives that are preferably used in the invention are shown below.

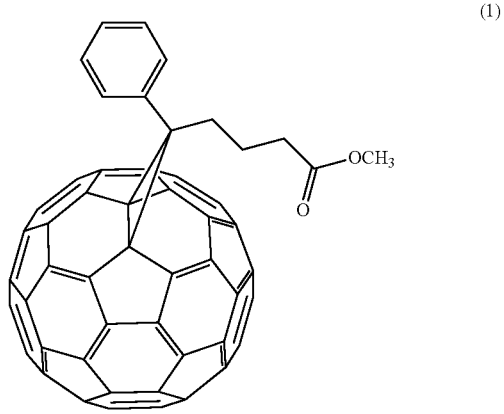

(1)

(2)
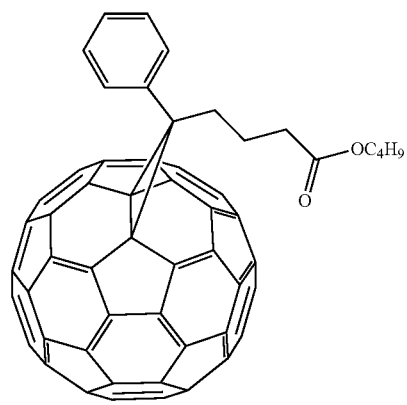
(3)
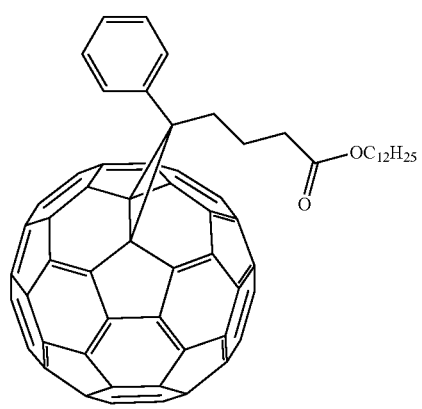
(4)
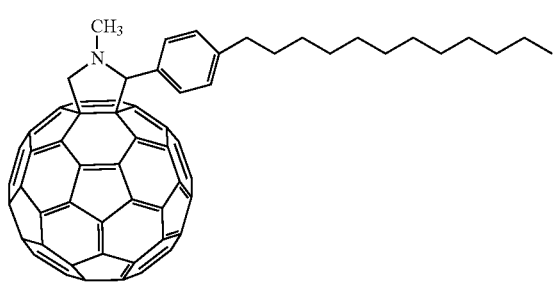
(5)
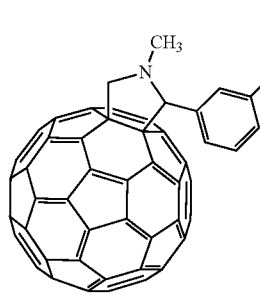
(6)
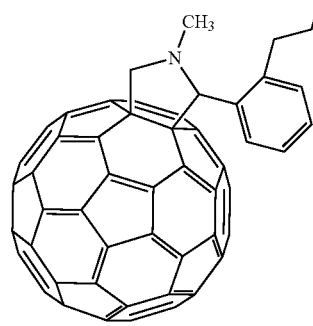
(7)
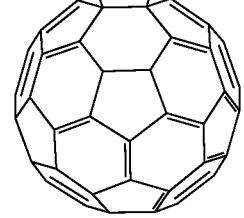
(8)

(9)

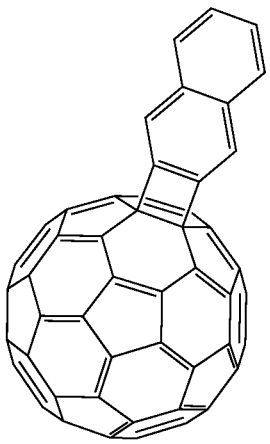

(10)

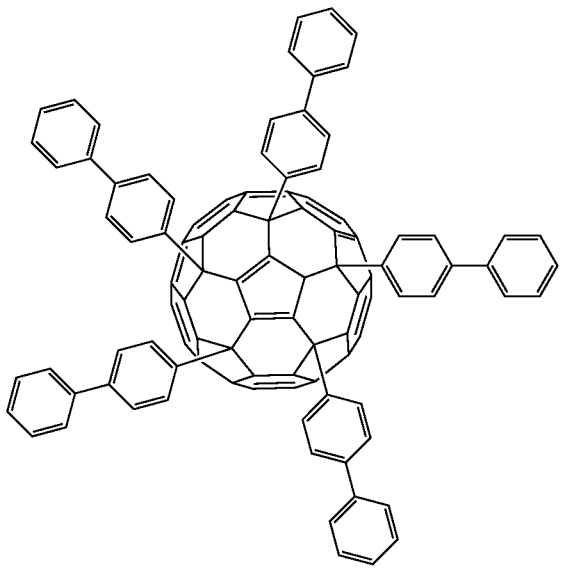

The fullerenes and fullerene derivatives described in The Chemical Society of Japan (ed.), *Quarterly Chemical Reviews* No. 43 (1999), JP 10-167994A, JP 11-255508A, JP 11-255509A, JP 2002-241323A, and JP 2003-196881A are also useful. The fullerenes and fullerene derivatives may be synthesized in accordance with known processes described, e.g., in The Chemical Society of Japan (ed.), *Quarterly Chemical Reviews* No. 43 (1999), JP 10-167994A, JP 11-255508A, JP 11-255509A, JP 2002-241323A, and JP 2003-196881A.

In the photoelectric conversion layer 9 containing a fullerene or a fullerene derivative, the photogenerated charges are rapidly transported through the molecules of the fullerene or the fullerene derivative to either the pixel electrode 6 or the counter electrode 10. When the molecules of the fullerene or the fullerene derivative are linked to form electron paths, the photoelectric conversion layer exhibits improved electron transport properties to provide a photoelectric conversion element having a fast response time. In this regard, it is desirable that a fullerene or a fullerene derivative be present in the photoelectric conversion layer 9 in an amount of 40% or more. It should be noted, however, that too high a content of a fullerene or a fullerene derivative means shortage of an organic p type semiconductor, which will result in reduction of junction interface and reduction of exciton dissociation efficiency.

It is preferred to use a triarylamine compound described in Japanese Patent 4213832 as an organic p type semiconductor to be mixed with a fullerene or a fullerene derivative. Using the triarylamine compound brings about an improved SN ratio. If the content of a fullerene or a fullerene derivative in the photoelectric conversion layer 9 is too high, the content of the triarylamine compound is relatively too low, resulting in reduction of light absorption and, consequently, reduction in photoelectric conversion efficiency. Therefore, the content of a fullerene or a fullerene derivative in the photoelectric conversion layer 9 is preferably not more than 85%.

The p type organic semiconductor that is preferably used to make the photoelectric conversion layer 9 is a compound represented by formula (3):

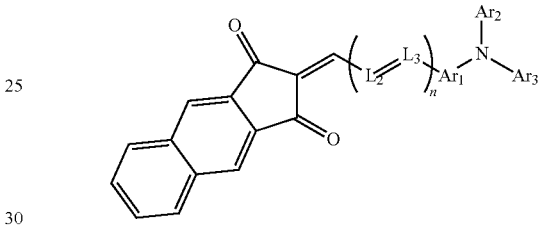

wherein each of $L_2$ and $L_3$ independently represents a methine group; n represents an integer of 0 to 2; $Ar_1$ represents a substituted or unsubstituted arylene group; and each of $Ar_2$ and $Ar_3$ independently represents a substituted or unsubstituted aryl group.

The arylene group as $Ar_1$ preferably contains 6 to 30, more preferably 6 to 18, carbon atoms. The arylene group may be substituted. The arylene group is preferably a C6-C18 arylene group optionally substituted with C1-C4 alkyl, such as phenylene, naphthylene, anthracenylene, methylphenylene, or dimethylphenylene. Phenylene or naphthylene is more preferred. Naphthylene is the most preferred.

The aryl group as $Ar_2$ and $Ar_3$ preferably contains 6 to 30, more preferably 6 to 18, carbon atoms. The aryl group may be substituted. The aryl group is preferably a C6-C18 aryl group optionally substituted with C1-C4 alkyl or C6-C18 aryl, such as phenyl, naphthyl, anthracenyl, methylphenyl, dimethylphenyl, or biphenyl. Phenyl or naphthyl is more preferred. Naphthyl is the most preferred.

n is preferably 0 or 1.

Examples of the compounds of formula (3) include, but are not limited to, the following compounds.

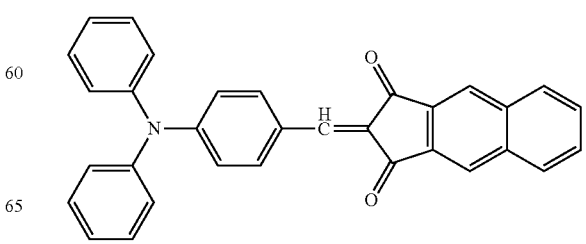

-continued

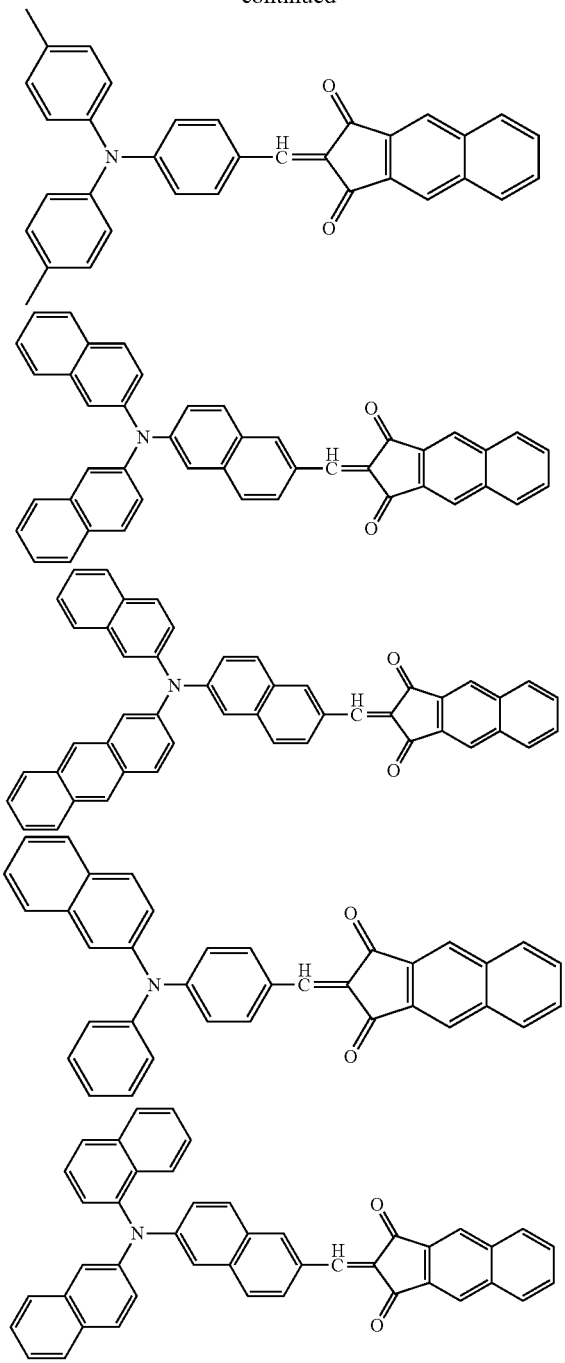

Using a fullerene as an n type organic semiconductor improves the performance of the organic photoelectric conversion element p as taught in JP 2007-123707A. To further improve the performance of the organic photoelectric conversion element P, the content of the fullerene in the photoelectric conversion element P having the heterojunction structure is preferably 40% to 85%.

Examples of fullerenes include fullerene $C_{60}$, $C_{70}$, $C_{76}$, $C_{78}$, $C_{80}$, $C_{82}$, $C_{84}$, $C_{90}$, $C_{96}$, $C_{240}$, and $C_{540}$, mixed fullerenes, and fullerene nanotube.

The photoelectric conversion element P of the solid state imaging device of the present embodiment has an intermediate layer 8 between the photoelectric conversion layer 9 and the pixel electrode 6 to improve the performance of the element P. In order for the intermediate layer 8 to function to improve the performance of the element P, the intermediate layer 8 is preferably formed of a material satisfying the condition that the difference between the ionization potential (hereinafter "Ip") of the intermediate layer 8 and the electron affinity (hereinafter "Ea") of the n type organic semiconductor of the photoelectric conversion layer 9 is at least 1 eV.

When the above condition is met, dark current is reduced effectively. To ensure the effect on dark current reduction, the difference between the Ip of the intermediate layer 8 and the Ea of the n type organic semiconductor of the photoelectric conversion layer 9 is preferably 1.2 eV or more.

The counter electrode 10, which must transmit visible light to the photoelectric conversion layer 9, is made of a material transparent to visible light, such as indium tin oxide (ITO). A bias voltage is to be applied to the counter electrode 10 through unshown wiring. When, for example, the imaging device is configured to collect holes in the pixel electrodes 6, the polarity of the bias voltage to be applied is decided so that holes may be swept to the pixel electrodes 6 while electrons are swept to the counter electrode 10.

The charge blocking layer 7, the intermediate layer 8, the photoelectric conversion layer 9, and the counter electrode 10 may each be divided into dedicated sections for each pixel 100. In the case where the counter electrode 10 is divided into dedicated sections for each pixel 100, the dedicated counter electrodes 10 are electrically connected to one another by wiring. The positional relation between the pixel electrodes 6 and the counter electrode 10 may be reverse. The positional relation between the charge blocking layer 7 and the photoelectric conversion layer 9 may be reverse. In the case where the positions of the charge blocking layer 7 and the photoelectric conversion layer 9 are reverse, the polarity of the bias voltage to be applied is such that electrons may be swept to the pixel electrodes 6 and holes may be swept to the counter electrode 10.

A sealing layer 11 is formed on the counter electrode 10. The color filters 12 are formed above the counter electrode 10 with the sealing layer 11 therebetween. The color filter 12 of the R pixel 100, which is indicated by "R" in FIG. 2, transmits R light. The color filter 12 of the G pixel 100, which is indicated by "G" in FIG. 2, transmits G light. The color filter 12 of the B pixel 100, which is indicated by "B" in FIG. 2, transmits B light.

Thus, the solid state imaging device illustrated in FIGS. 1 and 2, having the intermediate layer 8 between the charge blocking layer 7 and the photoelectric conversion layer 9, provides the following effect. The organic photoelectric conversion element P is prevented from performance deterioration even when exposed to high temperatures of 200° C. or higher. The charge blocking layer 7 and the photoelectric conversion layer 9 are allowed to have a Tg lower than 200° C. This provides a wider range of choice for the materials making the charge blocking layer 7 and the photoelectric conversion layer 9, allowing for further improvements of performance of the organic photoelectric conversion element P.

A Tg of a material may be raised by increasing the molecular size or introducing Tg-increasing substituents. However, the carrier transport performance of the material tends to reduce with the increases in molecular weight or in the number of the substituents. That is, the solid state imaging device of the invention may be said to have an intermediate layer 8 of a material with not-so-high carrier transport performance (e.g., a material having less carrier transport properties than the materials of the charge blocking layer 7 and the photoelectric conversion layer 9) between the charge blocking layer 7 and the photoelectric conversion layer 9. However, since the intermediate layer 8 is as thin as from about 3 to 10 nm, the reduction in carrier transport properties caused by the intermediate layer 8 is minimal. On the other hand, sufficient heat resistance is achieved with such a small thickness. Therefore, the provision of the intermediate layer 8 accomplishes improvement on heat resistance while retaining the carrier transport performance of the photoelectric conversion elements P, thereby making it feasible to fabricate a highly practical solid state imaging device.

The photoelectric conversion element P may have the charge blocking layer not only between the pixel electrode 6 and the photoelectric conversion layer 9 but between the counter electrode 10 and the photoelectric conversion layer 9. In the latter case, the intermediate layer may also be provided between the photoelectric conversion layer 9 and the charge blocking layer adjacent to the counter electrode 10 to improve the heat resistance of the organic photoelectric conversion element P.

It is preferred that the charge blocking layer 7 be made of an organic compound with a Tg of 150° C. or higher to have further improved heat resistance. Since an increase in Tg tends to result in reduction of carrier transport properties as discussed, the Tg of the compound of 150° C. or higher is to be decided taking into consideration the balance between improvement in heat resistance obtainable and reduction in carrier transport properties. In the cases when the charge blocking layer 7 has a multilayer structure composed of two or more sublayers, the sublayer adjacent to the intermediate layer 8 is preferably made of an organic compound with a Tg of 150° C. or higher.

While in the foregoing exemplary embodiment the imaging device conduct color separation using color filters 12, the color filers 12 may be dispensed with; and, instead, the photoelectric conversion layer is made of a material sensitive to G light or infrared light. In this alternative embodiment too, if the manufacturing process includes any step where the photoelectric conversion element is subjected to high temperatures of 200° C. or higher, the configuration of the invention is effective in preventing performance deterioration during the step.

The effect of the intermediate layer 8 on the improvement of the performance of the organic photoelectric conversion element P will be illustrated.

Example 1

An organic photoelectric conversion element is prepared by forming on a substrate, such as a glass plate, a pixel electrode, an electron blocking layer, an intermediate layer, a photoelectric conversion layer, and a counter electrode in the order described. The pixel electrode is made of titanium nitride (TiN). The electron blocking layer is deposited by vacuum evaporation of an organic compound (compound 1 shown below) having been purified by sublimation to a thickness of 50 nm. The intermediate layer is deposited by vacuum evaporation of an organic compound (compound 2 shown below) having been purified by sublimation to a thickness of 3 nm. The photoelectric conversion layer is formed by co-depositing an organic compound (compound 3 shown below) having been purified by sublimation and $C_{60}$ having been purified by sublimation in a compound 3 to $C_{60}$ volume ratio of 1:2 by vacuum evaporation to a thickness of 400 nm. The counter electrode is formed of ITO by radio frequency magnetron sputtering to a thickness of 10 nm.

Example 2

An organic photoelectric conversion element is made in the same manner as in Example 1, except for replacing compound 2 with compound 4 shown below having been purified by sublimation to form the intermediate layer.

Example 3

An organic photoelectric conversion element is made in the same manner as in Example 1, except for replacing compound 2 with compound 5 shown below having been purified by sublimation to form the intermediate layer.

Example 4

An organic photoelectric conversion element is made in the same manner as in Example 1, except for using compound 6 (shown below) having been purified by sublimation and $C_{60}$ in a volume ratio of 1:3 to form the photoelectric conversion layer.

Example 5

An organic photoelectric conversion element is made in the same manner as in Example 4, except for using compound 5 having been purified by sublimation to form the intermediate layer.

Example 6

An organic photoelectric conversion element is made in the same manner as in Example 1, except for using compound 7 (shown below) having been purified by sublimation to form the electron blocking layer.

Example 7

An organic photoelectric conversion element is made in the same manner as in Example 6, except for using compound 5 having been purified by sublimation to form the intermediate layer.

Example 8

An organic photoelectric conversion element is made in the same manner as in Example 1, except for using compound 9 (shown below) having been purified by sublimation to form the intermediate layer.

Example 9

An organic photoelectric conversion element is made in the same manner as in Example 6, except for using compound 9 having been purified by sublimation to form the intermediate layer.

Example 10

An organic photoelectric conversion element is made in the same manner as in Example 1, except for using compound 10 (shown below) having been purified by sublimation to form the intermediate layer.

Example 11

An organic photoelectric conversion element is made in the same manner as in Example 1, except for using compound 11 (shown below) having been purified by sublimation to form the intermediate layer.

Example 12

An organic photoelectric conversion element is fabricated in the same manner as in Example 1, except for increasing the thickness of the intermediate layer to 5 nm.

Example 13

An organic photoelectric conversion element is fabricated in the same manner as in Example 1, except for increasing the thickness of the intermediate layer to 8 nm.

Example 14

An organic photoelectric conversion element is fabricated in the same manner as in Example 1, except for increasing the thickness of the intermediate layer to 12 nm.

Example 15

An organic photoelectric conversion element is fabricated in the same manner as in Example 3, except for increasing the thickness of the intermediate layer to 5 nm.

Example 16

An organic photoelectric conversion element is fabricated in the same manner as in Example 3, except for increasing the thickness of the intermediate layer to 8 nm.

Example 17

An organic photoelectric conversion element is fabricated in the same manner as in Example 3, except for increasing the thickness of the intermediate layer to 12 nm.

Comparative Example 1

An organic photoelectric conversion element is fabricated by forming on a substrate, such as a glass plate, a pixel electrode, an electron blocking layer, a photoelectric conversion layer, and a counter electrode in the order described. The pixel electrode is made of TiN. The electron blocking layer is deposited by vacuum evaporation of compound 1 having been purified by sublimation to a thickness of 50 nm. The photoelectric conversion layer is formed by co-depositing compound 3 having been purified by sublimation and $C_{60}$ having been purified by sublimation in a volume ratio of 1:2 by vacuum evaporation to a thickness of 400 nm. The counter electrode is formed of ITO by radio frequency magnetron sputtering to a thickness of 10 nm.

Comparative Example 2

An organic photoelectric conversion element is made in the same manner as in Comparative Example 1, except for using compound 7 having been purified by sublimation to form the electron blocking layer.

Comparative Example 3

An organic photoelectric conversion element is made in the same manner as in Comparative Example 1, except for using compound 2 having been purified by sublimation to form the electron blocking layer.

Comparative Example 4

An organic photoelectric conversion element is made in the same manner as in Comparative Example 1, except for using compound 6 (shown below) having been purified by sublimation and $C_{60}$ in a volume ratio of 1:3 to form the photoelectric conversion layer.

Comparative Example 5

An organic photoelectric conversion element is made in the same manner as in Comparative Example 4, except for using compound 7 having been purified by sublimation to form the electron blocking layer.

Comparative Example 6

An organic photoelectric conversion element is made in the same manner as in Example 1, except for replacing compound 2 with compound 8 (shown below) having been purified by sublimation to form the electron blocking layer.

Comparative Example 7

An organic photoelectric conversion element is made in the same manner as in Comparative Example 6, except for using compound 7 having been purified by sublimation to form the electron blocking layer.

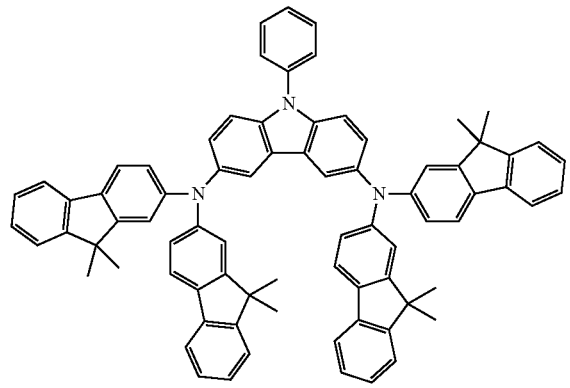

COMPOUND 1

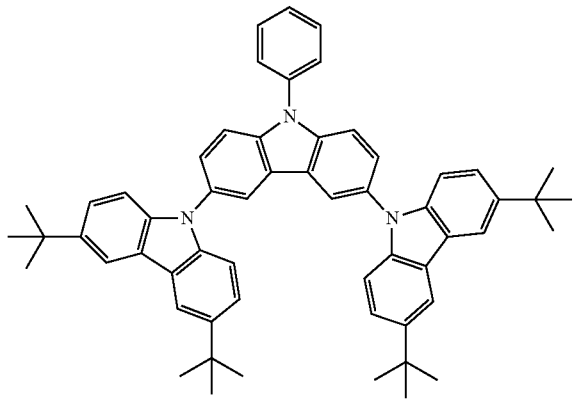

COMPOUND 2

-continued
COMPOUND 3
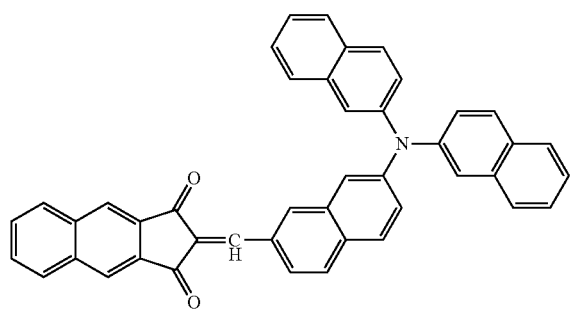
COMPOUND 4
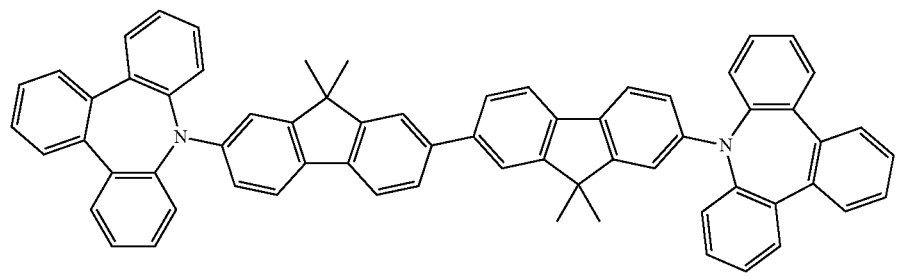
COMPOUND 5
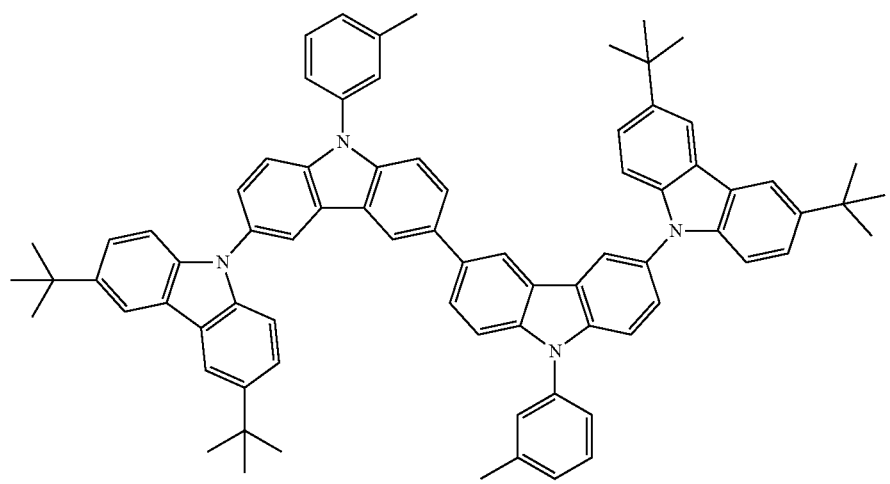
COMPOUND 6
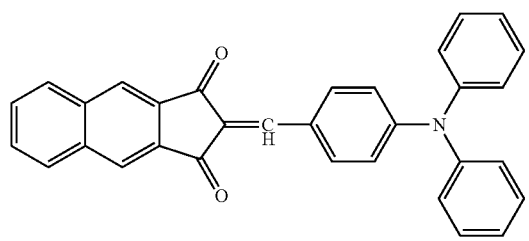
COMPOUND 7
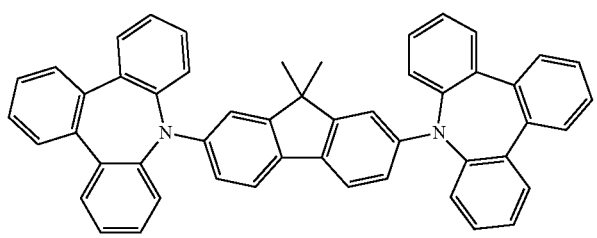

COMPOUND 8

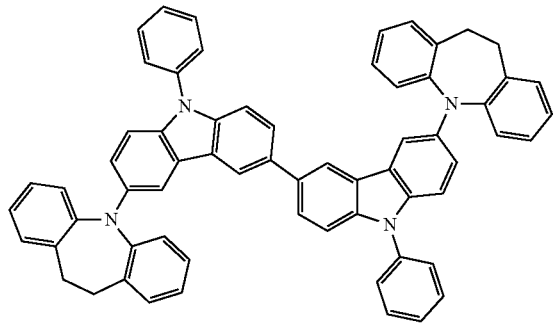

COMPOUND 9

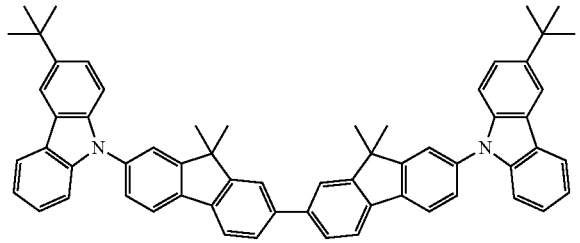

COMPOUND 10

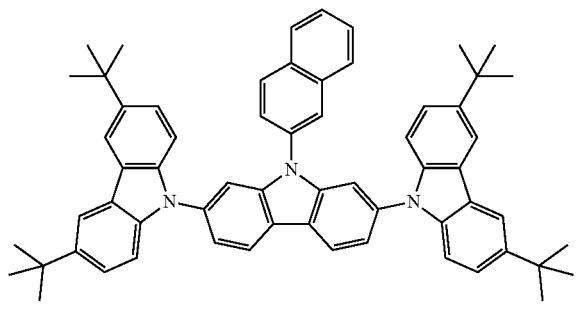

COMPOUND 11

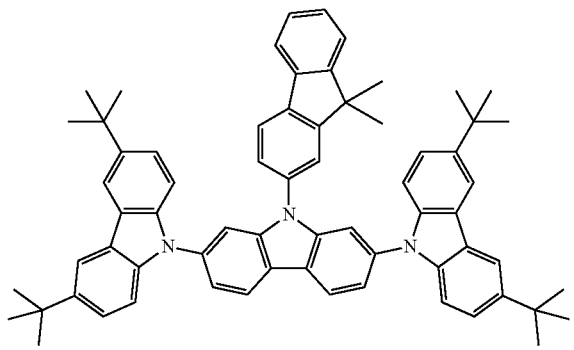

Table 1 shows the Tg and Ip of compounds 1 through 11.

TABLE 1

| No. | Tg (° C.) | Ip (eV) |
|---|---|---|
| 1 | 189 | 5.08 |
| 2 | 217 | 5.49 |
| 3 | 145 | 5.5 |
| 4 | 216 | 5.06 |
| 5 | 230 | 5.46 |
| 6 | 98 | 5.5 |
| 7 | 174 | 5.01 |
| 8 | 190 | 5.06 |
| 9 | 204 | 5.65 |
| 10 | 210 | 5.3 |
| 11 | 217 | 5.25 |

Each of the elements fabricated in Examples 1 through 17 and Comparative Examples 1 through 7 is transferred to a glove box in which the moisture and the oxygen concentration are 1 ppm or less while being kept away from contact with the air. In the glove box the element is sealed in a glass sealing member having a moisture absorbent attached thereto using a UV curing resin.

A positive bias voltage of $2.0 \times 10^5$ V/cm is applied to the counter electrode of the resulting photoelectric conversion element so that holes are collected from the pixel electrode to determine the dark current, IPCE, and response time. The IPCE is determined with light of 530 nm incident on the counter electrode side. The response time is defined to be the time needed for the photocurrent to reach 99% of the saturation. Subsequently, the element is subjected to heat treatment at 200° C. for 30 minutes. After the element is allowed to cool to room temperature, dark current, IPCE, and response time are determined again in the same manner as described above. The results obtained are shown in Tables 2-1 to 3-2.

TABLE 2-1

| Example No. | Electron Blocking Layer | | Intermediate Layer | | Photoelectric Conversion Layer | | |
|---|---|---|---|---|---|---|---|
| | Material | Thickness (nm) | Material | Thickness (nm) | Material | | Thickness (nm) |
| 1 | compound 1 | 50 | compound 2 | 3 | compound 3 | $C_{60}$ | 400 |
| 2 | compound 1 | 50 | compound 4 | 3 | compound 3 | $C_{60}$ | 400 |
| 3 | compound 1 | 50 | compound 5 | 3 | compound 3 | $C_{60}$ | 400 |
| 4 | compound 1 | 50 | compound 2 | 3 | compound 6 | $C_{60}$ | 400 |
| 5 | compound 1 | 50 | compound 5 | 3 | compound 6 | $C_{60}$ | 400 |
| 6 | compound 7 | 50 | compound 2 | 3 | compound 3 | $C_{60}$ | 400 |
| 7 | compound 7 | 50 | compound 5 | 3 | compound 3 | $C_{60}$ | 400 |
| 8 | compound 1 | 50 | compound 9 | 3 | compound 3 | $C_{60}$ | 400 |
| 9 | compound 1 | 50 | compound 9 | 3 | compound 3 | $C_{60}$ | 400 |
| 10 | compound 1 | 50 | compound 10 | 3 | compound 3 | $C_{60}$ | 400 |
| 11 | compound 1 | 50 | compound 11 | 3 | compound 3 | $C_{60}$ | 400 |
| 12 | compound 1 | 50 | compound 2 | 5 | compound 3 | $C_{60}$ | 400 |

TABLE 2-1-continued

| Example No. | Electron Blocking Layer Material | Thickness (nm) | Intermediate Layer Material | Thickness (nm) | Photoelectric Conversion Layer Material | | Thickness (nm) |
|---|---|---|---|---|---|---|---|
| 13 | compound 1 | 50 | compound 2 | 8 | compound 3 | $C_{60}$ | 400 |
| 14 | compound 1 | 50 | compound 2 | 12 | compound 3 | $C_{60}$ | 400 |
| 15 | compound 1 | 50 | compound 5 | 5 | compound 3 | $C_{60}$ | 400 |
| 16 | compound 1 | 50 | compound 5 | 8 | compound 3 | $C_{60}$ | 400 |
| 17 | compound 1 | 50 | compound 5 | 12 | compound 3 | $C_{60}$ | 400 |

TABLE 2-2

| Example No. | Performance of Element before Heat Treatment | | | Performance of Element after Heat Treatment | | |
|---|---|---|---|---|---|---|
| | IPCE (%) | Dark Current (A/cm$^2$) | Response Time (μs) | IPCE (%) | Dark Current (A/cm$^2$) | Response Time (μs) |
| 1 | 75 | 2.5E−10 | 10 | 75 | 2.5E−10 | 10 |
| 2 | 75 | 1.2E−09 | 10 | 75 | 1.2E−09 | 10 |
| 3 | 75 | 2.8E−10 | 10 | 75 | 2.8E−10 | 10 |
| 4 | 70 | 1.4E−10 | 8 | 70 | 1.4E−10 | 8 |
| 5 | 70 | 1.4E−10 | 8 | 70 | 1.4E−10 | 8 |
| 6 | 70 | 2.4E−10 | 10 | 70 | 2.4E−10 | 10 |
| 7 | 70 | 2.6E−10 | 10 | 70 | 2.6E−10 | 10 |
| 8 | 75 | 1.3E−10 | 10 | 75 | 1.3E−10 | 10 |
| 9 | 73 | 1.3E−10 | 10 | 73 | 1.3E−10 | 10 |
| 10 | 75 | 5.7E−10 | 10 | 75 | 5.7E−10 | 10 |
| 11 | 75 | 5.8E−10 | 10 | 75 | 5.8E−10 | 10 |
| 12 | 75 | 2.7E−10 | 15 | 75 | 2.7E−10 | 15 |
| 13 | 75 | 2.8E−10 | 30 | 75 | 2.2E−10 | 30 |
| 14 | 75 | 1.8E−10 | 120 | 75 | 1.8E−10 | 120 |
| 15 | 75 | 2.9E−10 | 13 | 75 | 2.9E−10 | 13 |
| 16 | 75 | 2.9E−10 | 28 | 75 | 2.9E−10 | 28 |
| 17 | 75 | 2.1E−10 | 100 | 75 | 2.1E−10 | 100 |

TABLE 3-1

| Comp. Example No. | Electron Blocking Layer Material | Thickness (nm) | Intermediate Layer Material | Thickness (nm) | Photoelectric Conversion Layer Material | | Thickness (nm) |
|---|---|---|---|---|---|---|---|
| 1 | compound 1 | 50 | none | — | compound 3 | $C_{60}$ | 400 |
| 2 | compound 7 | 50 | none | — | compound 3 | $C_{60}$ | 400 |
| 3 | compound 2 | 50 | none | — | compound 3 | $C_{60}$ | 400 |
| 4 | compound 1 | 50 | none | — | compound 6 | $C_{60}$ | 400 |
| 5 | compound 7 | 50 | none | — | compound 6 | $C_{60}$ | 400 |
| 6 | compound 1 | 50 | compound 8 | 3 | compound 3 | $C_{60}$ | 400 |
| 7 | compound 7 | 50 | compound 8 | 3 | compound 3 | $C_{60}$ | 400 |

TABLE 3-2

| Comp. Example No. | Performance of Element before Heat Treatment | | | Performance of Element after Heat Treatment | | |
|---|---|---|---|---|---|---|
| | IPCE (%) | Dark Current (A/cm$^2$) | Response Time (μs) | IPCE (%) | Dark Current (A/cm$^2$) | Response Time (μs) |
| 1 | 75 | 5.9E−10 | 10 | 68 | 5.4E−10 | 10 |
| 2 | 75 | 7.2E−09 | 10 | 65 | 8.0E−09 | 10 |
| 3 | 75 | 2.2E−10 | 3000 | 75 | 2.2E−10 | 3000 |
| 4 | 70 | 5.2E−10 | 8 | 62 | 8.4E−10 | 8 |
| 5 | 70 | 6.3E−10 | 8 | 60 | 6.3E−10 | 8 |
| 6 | 75 | 5.9E−10 | 10 | 69 | 3.7E−10 | 10 |
| 7 | 75 | 6.0E−10 | 10 | 69 | 4.2E−10 | 10 |

The photoelectric conversion elements of Examples 1 through 17 show substantially no change after the heat treatment. The elements of Comparative Examples 1, 2, 4, and 5 that have no intermediate layer show reduction in IPCE and increase in dark current after the heat treatment. The elements of Comparative Examples 6 and 7 that have an intermediate layer whose Tg is lower than 200° C. undergo reduction in IPCE and increase in dark current after the heat treatment. These results prove that the thermal deterioration of the performance of an organic photoelectric conversion element is prevented by providing an intermediate layer of an organic compound with a Tg of 200° C. or higher.

By comparing the thickness of the intermediate layer between Examples 1 to 11 (thickness=3 nm), Examples 12 and 15 (thickness=5 nm), Examples 13 and 16 (thickness=8 nm), and Examples 14 and 17 (thickness=12 nm), it is seen that the response speed increases as the thickness decreases (to the minimum of 3 nm). Comparison between the results of Examples 14 and 17 and those of Examples 13 and 16 shows that the response speed is drastically raised by decreasing the thickness of the intermediate from 12 nm to 8 nm. It is thus understandable that the response time will be short enough with the thickness of the intermediate layer being not more than 10 nm, the middle between 8 nm and 12 nm. It is seen by comparison between the results of Examples 13 and 16 and the results of Examples 12 and 15 that the response time is further shortened by decreasing the thickness of the intermediate layer to 5 nm or less. It is also seen from the results of Examples 1 to 11 that the response time is reduced to nearly single digit figures by decreasing the intermediate layer thickness to 3 nm Separately from the foregoing Examples and Comparative Examples, formation of an intermediate layer with a thickness smaller than 3 nm is unsuccessful, resulting in a failure to obtain sufficient effects of an intermediate layer as intended. Therefore, the lower limit of the intermediate layer thickness is preferably 3 nm.

In Examples 1 and 3 through 17 in which the difference between the Ea of $C_{60}$ (4.2 eV) and the Ip of the intermediate layer is 1 eV or greater, the dark current is small. In Examples 1, 3 to 9, and 12 to 17 in which that difference is 1.2 eV or greater, the dark current is particularly small.

Although the photoelectric conversion element of Comparative Example 3 exhibits improved heat resistance by virtue of the electron blocking layer made of the material having a high Tg of 217° C., it has reduced carrier transport performance, resulting in a failure to secure a desire response time. This indicates that merely raising the Tg of one or both of the charge blocking layer and the photoelectric conversion layer to 200° C. or higher improves heat resistance but impairs the response speed. Accordingly, in order to improve the response, it is advantageous for the organic photoelectric conversion element having an intermediate layer with a Tg of 200° C. or higher that the charge blocking layer and the photoelectric conversion layer thereof have a Tg lower than 200° C.

As described, the present invention discloses the following.

The invention discloses a photoelectric conversion element including a pair of electrodes, a photoelectric conversion layer containing an organic material between the electrodes, and a charge blocking layer between the photoelectric conversion layer and at least one of the electrodes. The photoelectric conversion element further includes an intermediate layer of an organic compound having a Tg of 200° C. or higher between the photoelectric conversion layer and the charge blocking layer.

Even when the photoelectric conversion layer and the charge blocking layer of the disclosed photoelectric conversion element have a Tg lower than 200° C., and the photoelectric conversion element is placed in high temperatures of 200° C. or higher, and the photoelectric conversion layer and the charge blocking layer undergo transition to a glassy state; the intermediate layer prevents deterioration of the performance of these layers because the intermediate layer is made of an organic compound with a Tg of 200° C. or higher. This offers a wider freedom of choice of the materials making the photoelectric conversion layer and the charge blocking layer, making it possible to provide a photoelectric conversion element with both improved heat resistance and improved performance.

The disclosed photoelectric conversion element embraces a first embodiment in which the intermediate layer has a thickness of 10 nm or smaller.

According to the embodiment, the performance of the photoelectric conversion element is further improved while preventing deterioration due to heat.

The disclosed photoelectric conversion element embraces a second embodiment in which the intermediate layer has a thickness of 5 nm or smaller.

According to the second embodiment, the performance of the photoelectric conversion element is still further improved while preventing deterioration due to heat.

The disclosed photoelectric conversion element embraces a third embodiment in which the intermediate layer has a thickness of 3 nm.

According to the third embodiment, the performance of the photoelectric conversion element is yet further improved while preventing deterioration due to heat.

The disclosed photoelectric conversion element embraces a fourth embodiment in which each of the photoelectric conversion layer and the charge blocking layer contains a material having a lower Tg than the intermediate layer.

The disclosed photoelectric conversion element embraces a fifth embodiment in which the charge blocking layer is designed to control electron injection from the adjacent electrode.

The disclosed photoelectric conversion element embraces a sixth embodiment in which the intermediate layer contains an organic compound having a tert-butyl group.

According to the sixth embodiment, although the charge transport performance slightly reduces, performance deterioration due to high temperatures is prevented, so that the performance improves on the whole.

The disclosed photoelectric conversion element embraces a seventh embodiment in which the charge blocking layer has a single layer structure or a multilayer structure having two or more sublayers, and the single layered charge blocking layer or the sublayer adjacent to the intermediate layer is made of an organic compound with a Tg of 150° C. or higher.

The disclosed photoelectric conversion element embraces an eighth embodiment in which the photoelectric conversion layer has a bulk heterojunction structure formed of a mixture of a fullerene or a fullerene derivative and a p type organic semiconductor, and the difference between the Ip of the intermediate layer and the Ea of the fullerene or the fullerene derivative is at least 1 eV.

According to the eighth embodiment, dark current generation is reduced, and the performance is so improved.

The disclosed photoelectric conversion element embraces a ninth embodiment in which the photoelectric conversion layer has a bulk heterojunction structure formed of a mixture of a fullerene or a fullerene derivative and a p type organic semiconductor, and the difference between the Ip of the intermediate layer and the Ea of the fullerene or the fullerene derivative is at least 1.2 eV.

According to the ninth embodiment, dark current generation is further reduced, and the performance is so improved.

The disclosed photoelectric conversion element embraces a tenth embodiment in which the photoelectric conversion layer has a bulk heterojunction structure formed of a mixture of a fullerene or a fullerene derivative and a p type organic semiconductor, and the content of the fullerene or the fullerene derivative in the photoelectric conversion layer is 40% to 85%.

The tenth embodiment optimizes the performance of the photoelectric conversion element.

The disclosed photoelectric conversion element embraces an eleventh embodiment in which the charge blocking layer and the intermediate layer have a total thickness of at least 20 nm.

The eleventh embodiment optimizes the performance of the photoelectric conversion element.

The disclosed photoelectric conversion element embraces a twelfth embodiment in which the charge blocking layer and the intermediate layer have a total thickness of 50 nm or more.

The twelfth embodiment optimizes the performance of the photoelectric conversion element.

The invention also discloses a solid state imaging device including a plurality of the photoelectric conversion elements of the invention, a color filter provided above each of the photoelectric conversion elements, and a read-out portion reading a signal corresponding to the charge photogenerated in the photoelectric conversion layer of each photoelectric conversion element.

100 pixel
6 pixel electrode
7 charge blocking layer
8 intermediate layer
9 photoelectric conversion layer
10 counter electrode

What is claimed is:

1. A photoelectric conversion element comprising:
   a pair of electrodes;
   a photoelectric conversion layer that contains an organic material between the electrodes;
   a charge blocking layer that is disposed between the photoelectric conversion layer and one of the electrodes; and
   an intermediate layer that includes an organic compound disposed between the photoelectric conversion layer and the charge blocking layer and having a glass transition temperature of 200° C. or higher.

2. The photoelectric conversion element according to claim 1, wherein the intermediate layer has a thickness of 10 nm or smaller.

3. The photoelectric conversion element according to claim 2, wherein the intermediate layer has a thickness of 5 nm or smaller.

4. The photoelectric conversion element according to claim 3, wherein the intermediate layer has a thickness of 3 nm.

5. The photoelectric conversion element according to claim 1, wherein each of the photoelectric conversion layer and the charge blocking layer includes a material having a lower glass transition temperature than the intermediate layer.

6. The photoelectric conversion element according to claim 1, wherein the charge blocking layer is an electron blocking layer that controls electron injection from the adjacent electrode.

7. The photoelectric conversion element according to claim 1, wherein the intermediate layer includes an organic compound having a tert-butyl group.

8. The photoelectric conversion element according to claim 1, wherein the charge blocking layer has a single layer structure or a multilayer structure having two or more sublayers, and the single layered charge blocking layer or the sublayer adjacent to the intermediate layer contains an organic compound with a glass transition temperature of 150° C. or higher.

9. The photoelectric conversion element according to claim 1, wherein the photoelectric conversion layer has a bulk heterojunction structure formed of a mixture of a fullerene or a fullerene derivative and a p type organic semiconductor, and the difference between the ionization potential of the intermediate layer and the electron affinity of the fullerene or the fullerene derivative is at least 1 eV.

10. The photoelectric conversion element according to claim 9, wherein the difference between the ionization potential of the intermediate layer and the electron affinity of the fullerene or the fullerene derivative is 1.2 eV or more.

11. The photoelectric conversion element according to claim 1, wherein the photoelectric conversion layer has a bulk heterojunction structure formed of a mixture of a fullerene or a fullerene derivative and a p type organic semiconductor, and the content of the fullerene or the fullerene derivative in the photoelectric conversion layer is 40% to 85%.

12. The photoelectric conversion element according to claim 1, wherein the charge blocking layer and the intermediate layer have a total thickness of at least 20 nm.

13. The photoelectric conversion element according to claim 12, wherein the charge blocking layer and the intermediate layer have a total thickness of 50 nm or more.

14. A solid-state imaging device comprising:
    a plurality of the photoelectric conversion elements;
    a color filter that is disposed above each of the photoelectric conversion elements; and
    a read-out portion that reads a signal corresponding to charge photogenerated in the photoelectric conversion layer of each photoelectric conversion element,
    wherein each of the photoelectric conversion element includes:
       a pair of electrodes;
       a photoelectric conversion layer that contains an organic material between the electrodes;
       a charge blocking layer that is disposed between the photoelectric conversion layer and one of the electrodes; and
       an intermediate layer that includes an organic compound disposed between the photoelectric conversion layer and the charge blocking layer and having a glass transition temperature of 200° C. or higher.

* * * * *